United States Patent
Jeong

(10) Patent No.: US 11,793,047 B2
(45) Date of Patent: Oct. 17, 2023

(54) DISPLAY PANEL AND DISPLAY DEVICE INCLUDING THE SAME

(71) Applicant: LG Display Co., Ltd., Seoul (KR)

(72) Inventor: Duk Young Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 203 days.

(21) Appl. No.: 17/506,418

(22) Filed: Oct. 20, 2021

(65) Prior Publication Data

US 2022/0123065 A1 Apr. 21, 2022

(30) Foreign Application Priority Data

Oct. 21, 2020 (KR) .................. 10-2020-0136844

(51) Int. Cl.
| | | |
|---|---|---|
| H10K 59/35 | (2023.01) | |
| H10K 50/86 | (2023.01) | |
| H10K 59/65 | (2023.01) | |
| H10K 59/126 | (2023.01) | |
| G02B 27/00 | (2006.01) | |
| G02B 27/58 | (2006.01) | |

(52) U.S. Cl.
CPC ......... *H10K 59/353* (2023.02); *H10K 50/865* (2023.02); *H10K 59/126* (2023.02); *H10K 59/352* (2023.02); *H10K 59/65* (2023.02); *G02B 27/0018* (2013.01); *G02B 27/58* (2013.01)

(58) Field of Classification Search
None
See application file for complete search history.

(56) References Cited

U.S. PATENT DOCUMENTS

| | | | |
|---|---|---|---|
| 2016/0104750 A1* | 4/2016 | Jinta | H10K 59/352 257/40 |
| 2020/0403168 A1* | 12/2020 | Li | H10K 77/10 |
| 2023/0078687 A1* | 3/2023 | Mochizuki | G06V 40/1318 257/40 |

FOREIGN PATENT DOCUMENTS

| | | |
|---|---|---|
| CN | 111599840 A | 8/2020 |
| CN | 112713252 A | 4/2021 |
| WO | WO 2021/235144 A1 | 11/2021 |

\* cited by examiner

*Primary Examiner* — Erik T. K. Peterson
*Assistant Examiner* — Christopher A. Schodde
(74) *Attorney, Agent, or Firm* — Birch, Stewart, Kolasch & Birch, LLP

(57) ABSTRACT

Provided is a display panel including a display area including a first pixel region in which a plurality of pixels are disposed and an image-capturing area including a second pixel region in which a plurality of pixel groups are disposed and a plurality of light-transmitting portions are disposed between the pixel groups. The light-transmitting portions are disposed along virtual spiral reference lines which spirally extend outward from the center of the image-capturing area, and sizes of the light-transmitting portions increase as a distance from the center of the image-capturing area increases.

20 Claims, 21 Drawing Sheets or

DISPLAY PANEL AND DISPLAY DEVICE INCLUDING THE SAME

CROSS-REFERENCE TO RELATED APPLICATION

This application claims the benefit of priority to Korean Patent Application No. 10-2020-0136844, filed in the Republic of Korea on Oct. 21, 2020, the entire contents of which are incorporated herein by reference in its entirety into the present application.

BACKGROUND

1. Field

The present disclosure relates to a display panel including an image-capturing area in which pixels for displaying an image are disposed and a display device including the display panel.

2. Discussion of Related Art

Light-emitting display devices are classified into inorganic light-emitting display devices and organic light-emitting display devices according to the material of the emission layer. Active matrix-type organic light-emitting display devices include organic light-emitting diodes (OLEDs) which emit light by themselves and have merits of high response speed, high brightness, and a large viewing angle.

In an OLED display device, an OLED is formed in each pixel. Since the OLED display device does not only has high response speed, excellent light-emitting efficiency, excellent brightness, and an excellent viewing angle but also can display a black gray level in perfect black, the contrast ratio and color gamut are excellent.

In the meantime, the multimedia function of mobile terminals is being improved. For example, a camera is basically embedded in smart phones, and the resolution of the camera is being increased as high as that of existing digital cameras. However, the front camera of smart phones imposes limitations on the screen design and thus can make the screen design difficult. To reduce a space occupied by a camera, a screen design including a notch or a punch hole has been adopted by smart phones, but the screen size is still limited by the camera so that a full-screen display may not be implemented.

In order to implement a full-screen display, a method of providing an image-capturing area in which low-resolution pixels are disposed in the screen of a display panel and putting a camera at a position opposite to the image-capturing area under the display panel is proposed. The image-capturing area in the screen operates as a transparent display for displaying an image. Since interference fringes can appear in images captured through such an image-capturing area, however, image quality may need to be improved.

SUMMARY OF THE DISCLOSURE

An object of the present disclosure is to address the above-mentioned issues and/or other limitations associated with the related art.

The present disclosure is to provide a display panel capable of improving quality of image captured by an imaging device, and a display device including the same.

The problems to be solved or addressed in the embodiments of the present disclosure are not limited thereto, and can also include the objects and effects that can be identified from the solutions or embodied forms of the problems described below.

In a display panel according to an embodiment of the disclosure, the display panel comprises a display area including a first pixel region in which a plurality of pixels are disposed; and an image-capturing area including a second pixel region in which a plurality of pixel groups are disposed and light-transmitting portions are disposed between the pixel groups, wherein the light-transmitting portions are disposed along virtual spiral reference lines which spirally extend outward from a center of the image-capturing area, and sizes of the light-transmitting portions increase as a distance from the center of the image-capturing area increases.

The virtual spiral reference lines can include Fibonacci spirals.

Each of the light-transmitting portions can be in a circular shape or an oval shape.

Each of the first pixel region and the second pixel region can include a light shield layer; and a metal layer having a higher absorption coefficient than the light shield layer with respect to a specific wavelength of a laser beam. The light shield layer can include a metal or an inorganic film and can be removed from light-transmitting regions in the image-capturing area to expose the light-transmitting portions. The metal layer can be removed from the light-transmitting regions in the image-capturing area to expose the light-transmitting portions.

At least one of the light-transmitting portions can include overlapping regions which overlap the pixel groups. The light shield layer can be not removed from the overlapping regions.

At least some of the light-transmitting portions can include overlapping regions which overlap the pixel groups, and the metal layer can be not removed from the overlapping regions.

The light shield layer can include molybdenum (Mo) or amorphous silicon (a-Si), and the metal layer can include magnesium (Mg).

The first and second pixel regions can include a circuit layer on a substrate; and a light-emitting element layer on the circuit layer. The light shield layer can be disposed in the circuit layer.

The circuit layer can include a transistor connected to a light-emitting element of the light-emitting element layer, and the light shield layer can be disposed between inorganic insulating layers under the transistor.

Each of the pixel regions of the display area and the image-capturing area further can include a light shield pattern disposed between the light shield layer and the transistor, and the light shield pattern can include a metal.

The first pixel region can have higher pixels per inch (PPI) than the second pixel region.

In a display panel according to another embodiment of the disclosure, the display panel comprises a display panel including a display area including a first pixel region in which a plurality of pixels are disposed and an image-capturing area including a second pixel region in which a plurality of pixel groups are disposed and light-transmitting portions are disposed between the pixel groups; a cover glass configured to cover the display panel; and an imaging element module disposed under the display panel and opposite to the image-capturing area, wherein the light-transmitting portions are disposed along virtual spiral reference lines which spirally extend outward from a center of the image-capturing area, and sizes of the light-transmitting portions increase as a distance from the center of the image-capturing area increases.

The virtual spiral reference lines can include Fibonacci spirals.

Each of the light-transmitting portions can be in a circular shape or an oval shape.

Each of the first pixel region and the second pixel region can include a light shield layer; and a metal layer having a higher absorption coefficient than the light shield layer with respect to a specific wavelength of a laser beam. The light shield layer can include a metal or an inorganic film, and can be removed from light-transmitting regions in the image-capturing area to expose the light-transmitting portions. The metal layer can be removed from the light-transmitting regions in the image-capturing area to expose the light-transmitting portions.

At least one of the light-transmitting portions can include overlapping regions which overlap the pixel groups, and the light shield layer and the metal layer can be not removed from the overlapping regions.

The first and second pixel regions can include a circuit layer on a substrate; and a light-emitting element layer on the circuit layer. The light shield layer can be in the circuit layer.

The circuit layer can include a transistor connected to a light-emitting element of the light-emitting element layer, and the light shield layer is disposed between inorganic insulating layers under the transistor.

Each of the pixel regions of the display area and the image-capturing area further can include a light shield pattern disposed between the light shield layer and the transistor, and the light shield pattern can include a metal.

The first pixel region can have higher pixels per inch (PPI) than the second pixel region.

The present disclosure is directed to removing interference fringes which can appear in a captured image by randomly arranging light-transmitting portions.

The present disclosure is also directed to implementing a full-screen display effectively.

Effects of the present disclosure are not limited to those described above, and other effects which have not been described will be clearly understood by those of ordinary skill in the art from the claims.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Figure 1:
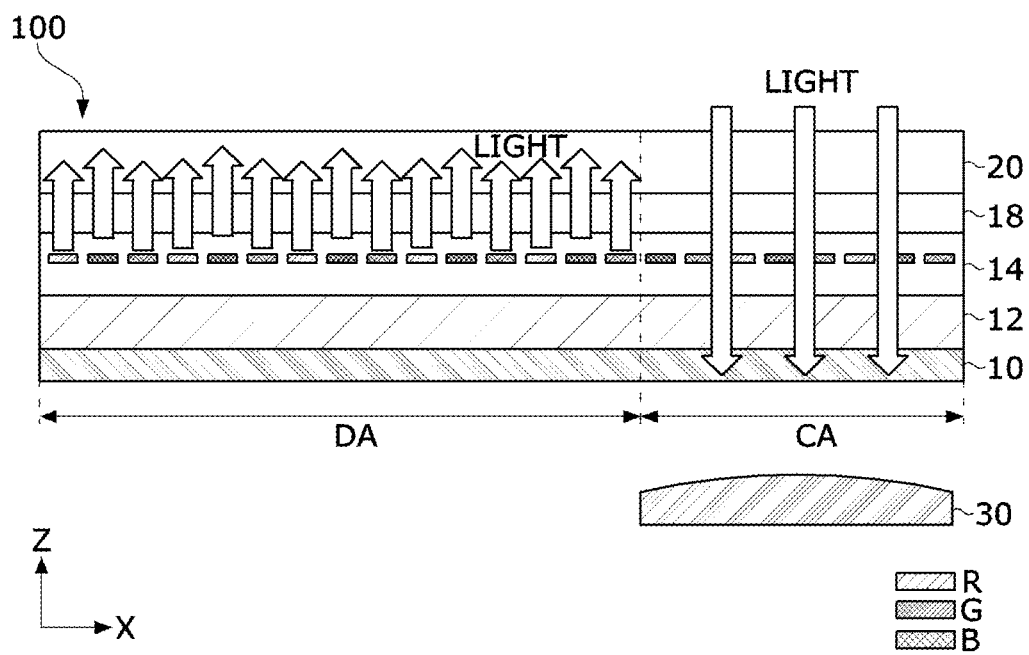
FIG. 1 is a schematic cross-sectional view of a display panel according to an embodiment of the present disclosure.

The advantages and features of the present disclosure, and how to accomplish them, will become apparent with reference to the embodiments described in detail below together with the accompanying drawings. However, the present disclosure is not limited to embodiments disclosed below, and can be implemented in various forms. These embodiments are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout. In the following description, when a detailed description of well-known functions or configurations related to this document is determined to unnecessarily cloud a gist of the disclosure, the detailed description thereof may be omitted or may be provided briefly.

In the present disclosure, when the terms "include", "have", "comprised of", etc. are used, other components can be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. can be used to describe various components, but the components are not limited by such terms. The terms are used only for the purpose of distinguishing one component from other components. For example, a first component can be designated as a second component without departing from the scope of the present disclosure.

The features of various embodiments of the present disclosure can be partially combined or entirely combined with each other, and can be technically interlocking-driven in various ways. The embodiments can be independently implemented, or can be implemented in conjunction with each other.

Hereinafter, various embodiments of the present disclosure will be described in detail with reference to the accompanying drawings. All the components of each display panel and each display device according to all embodiments of the present disclosure are operatively coupled and configured.

FIG. 1 is a schematic cross-sectional view of a display panel according to an embodiment of the present disclosure.

Figure 2:
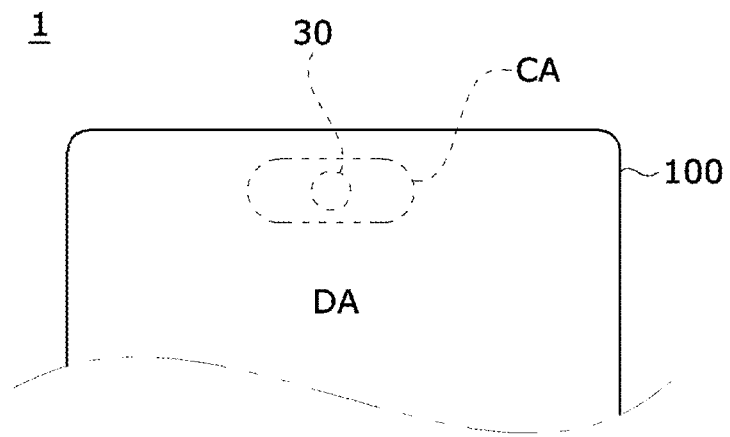
FIG. 2 is a plan view showing a sensor area and a part of a main display area in a display device according to an embodiment of the present disclosure.

FIG. 2 is a plan view showing a sensor area and a part of a main display area in a display device according to an embodiment of the present disclosure.

Referring to FIGS. 1 and 2, a display device 1 includes a display panel 100 and an imaging element module 30 disposed under the display panel 100. More specifically, the display panel 100 can include an image-capturing area CA, and the imaging element module 30 can be positioned under the image-capturing area CA.

The display area DA and the image-capturing area CA include a pixel array in which pixels P, to which pixel data is written, are arranged. The number of pixels per unit area, for example, pixels per inch (PPI), of the image-capturing area CA is smaller than that of the display area DA in order to ensure transmissivity of the image-capturing area CA.

The pixel array of the display area DA includes a pixel region (a first pixel region) in which a plurality of pixels are arranged at high PPI. The pixel array of the image-capturing area CA includes a pixel region (a second pixel region) in which a plurality of pixels are arranged at relatively low PPI because the pixels are spaced apart from each other by light-transmitting portions. In the image-capturing area CA, external light can pass through the display panel 100 through light-transmitting portions having high transmissivity to be incident on the imaging element module 30 under the display panel 100.

Since the display area DA and the image-capturing area CA include the pixels P, an input image is displayed in the display area DA and the image-capturing area CA.

Each of the pixels P in the display area DA and the image-capturing area CA includes subpixels of different colors to display image colors. The subpixels include a red (R) subpixel, a green (G) subpixel, and a blue (B) subpixel. Each of the pixels P can further include a white (W) subpixel. Each subpixel can include a pixel circuit and a light-emitting element (an organic light-emitting diode (OLED)).

The image-capturing area CA includes pixels and the imaging element module 30 disposed under the screen of the display panel 100. In a display mode, pixel data of an input image is written to the pixels P in the image-capturing area CA, and the pixels P display the input image. In an image-capturing mode, the imaging element module 30 captures an external image and outputs picture or video image data. The imaging element module 30 is opposite to the image-capturing area CA. In other words, when viewed from the front of the display device, the imaging element module 30 can overlap the image-capturing area CA. External light is incident on the imaging element module 30 through the image-capturing area CA, and the imaging element module 30 condenses the light onto an image sensor.

An image quality compensation algorithm for compensating for the brightness and color coordinates of the pixels P in the image-capturing area CA due to pixels removed from the image-capturing area CA can apply to ensure transmissivity.

Since low-resolution pixels are arranged in the image-capturing area CA, the display area of the screen is not limited by an imaging element module. Accordingly, the present disclosure makes it possible to implement a full-screen display.

The display panel 100 has a width in an X-axis direction, a length in a Y-axis direction, and a thickness in a Z-axis direction. The display panel 100 includes a circuit layer 12 disposed on a substrate 10 and a light-emitting element layer 14 disposed on the circuit layer 12. A polarizing plate 18 can be disposed on the light-emitting element layer 14, and a cover glass 20 can be disposed on the polarizing plate 18.

The circuit layer 12 can include pixel circuits connected to interconnections, such as data lines, gate lines, and power lines, a gate driver connected to the gate lines, and the like. The circuit layer 12 can include circuit elements such as a transistor implemented as a thin film transistor (TFT) and a capacitor. The interconnections and circuit elements can be implemented using a plurality of insulating layers, two or more metal layers separated with the insulating layer interposed therebetween, and an active layer including a semiconductor material.

The light-emitting element layer 14 can include light-emitting elements which are driven by the pixel circuits. The light-emitting elements can be implemented as OLEDs. The OLEDs include an organic compound layer formed between the anode and the cathode. The organic compound layer can include a hole injection layer (HIL), a hole transport layer (HTL), an emission layer (EML), an electron transport layer (ETL), and an electron injection layer (EIL) but is not limited thereto. When a voltage is applied to the anode and the cathode of the OLED, holes passing through the HTL and electrons passing through the ETL are moved to the EML and form excitons so that visible light is emitted from the EML. The light-emitting element layer 14 can be disposed on the pixels which selectively transmit red, green, and blue wavelengths and can further include a color filter array.

The light-emitting element layer 14 can be covered by a protection film which can be covered by an encapsulation layer. The protection film and the encapsulation layer can have a structure obtained by alternately depositing an organic film and an inorganic film. The inorganic film prevents infiltration of moisture or oxygen. The organic film planarizes the surface of the inorganic film. When the organic film and the inorganic film are repeatedly stacked, the path of moisture or oxygen lengthens as compared to the case of a single layer. Accordingly, it is possible to effectively prevent infiltration of moisture or oxygen which affects the light-emitting element layer 14.

The polarizing plate 18 can adhere onto the encapsulation layer. The polarizing plate 18 improves the outdoor visibility of the display device. The polarizing plate 18 increases the brightness of the pixels by reducing light reflected from the surface of the display panel 100 and blocking light reflected from the metal of the circuit layer 12. The polarizing plate 18 can be implemented as a polarizing plate in which a linear polarizing plate and a phase delay film are bonded together or a circular polarizing plate.

In the display panel of the present disclosure, each of the pixel regions of the display area DA and the image-capturing area CA includes a light shield layer. The light shield layer is removed from light-transmitting portions of the image-capturing area CA to define the light-transmitting portions. The light shield layer includes open pores corresponding to the light-transmitting portions. The light shield layer is removed from the open pores. The light shield layer is formed of a metal or inorganic film having a lower absorption coefficient than a metal removed from the light-transmitting portions with respect to the wavelength of a laser beam used in a laser ablation process for removing a metal layer present in the light-transmitting portions.

Figure 3:
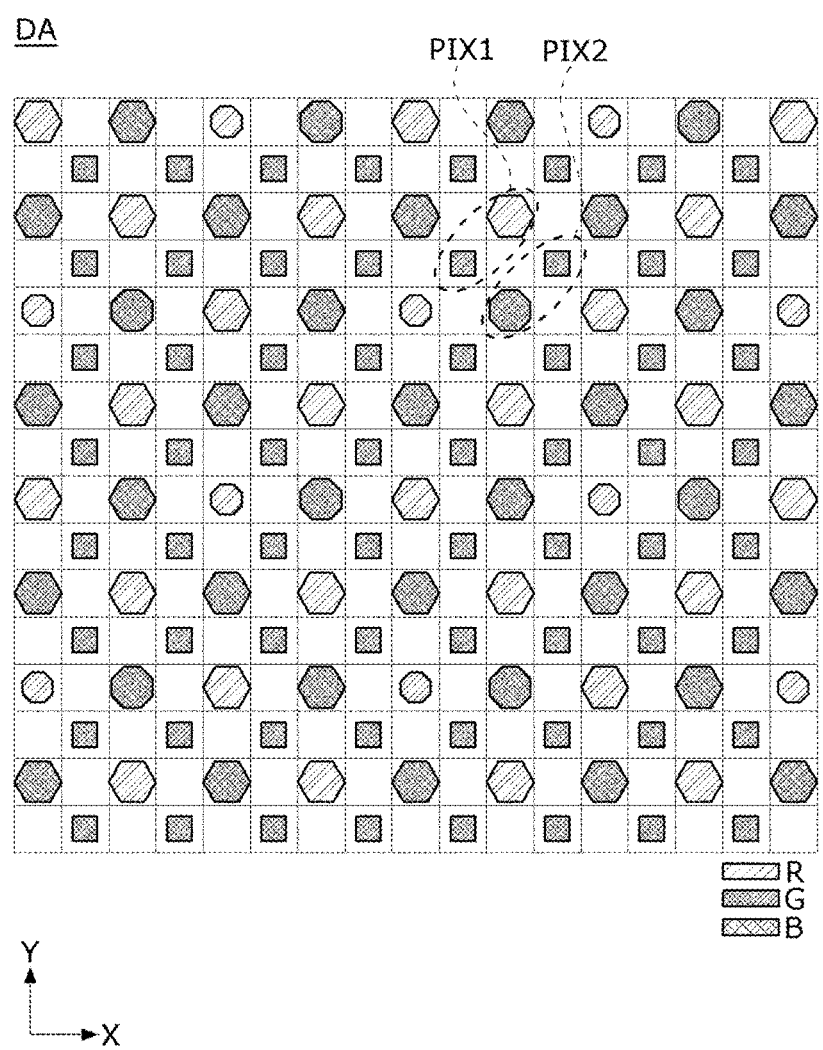
FIG. 3 is a diagram showing an example of a pixel arrangement in a display area (DA)
Figure 4:
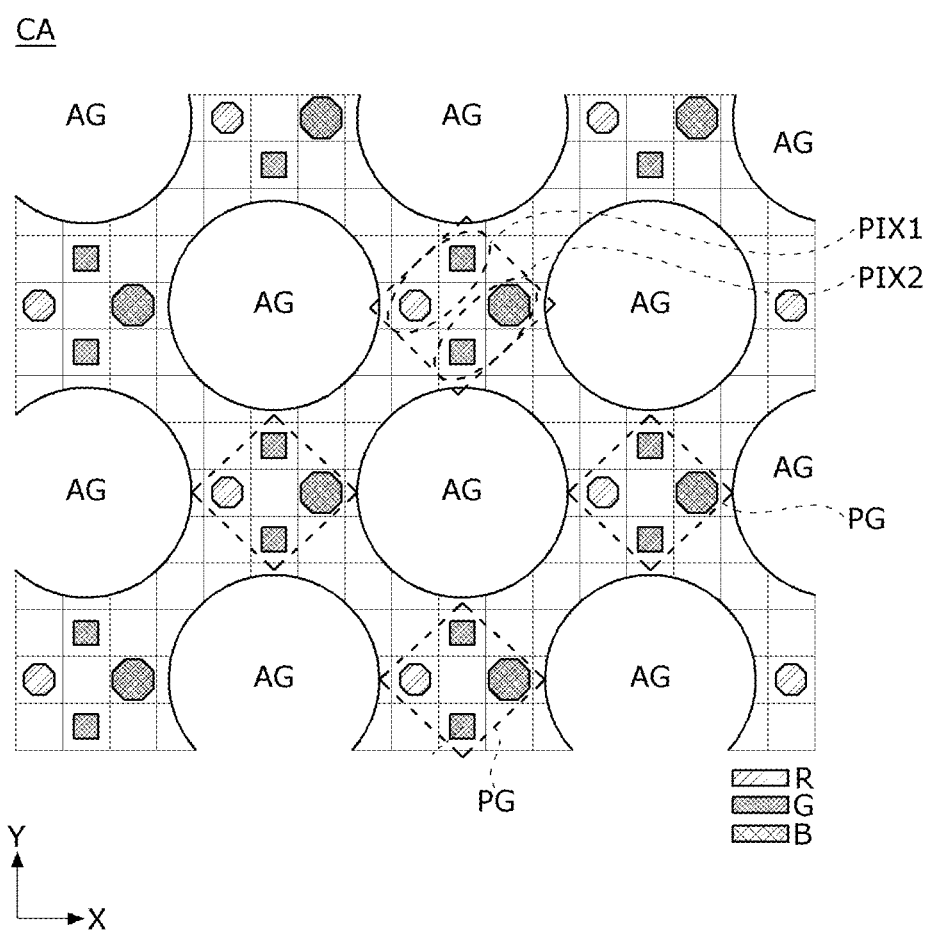
FIG. 4 is a diagram showing an example of pixels in an image-capturing area (CA) and light-transmitting portions.

FIG. 3 is a diagram showing an example of a pixel arrangement in the display area DA. FIG. 4 is a diagram showing an example of the pixels in the image-capturing area CA and the light-transmitting portions. In FIGS. 3 and 4, interconnections connected to the pixels are omitted so as to focus on the features being described.

The pixel arrangement of the display device according to the embodiment of the present disclosure will be described below with reference to FIGS. 3 and 4.

Referring to FIG. 3, the display area DA includes pixels PIX1 and PIX2 arranged at high PPI. Each of the pixels PIX1 and PIX2 can be implemented as a real-type pixel including R, G, and B, which are three primary colors, subpixels. Each of the pixels PIX1 and PIX2 can further include a W subpixel. Further, a subpixel rendering algorithm can be used to constitute one pixel with two subpixels. For example, the pixel rendering algorithm can be used to constitute the first pixel PIX1 with R and G subpixels and constitute the second pixel PIX2 with B and G subpixels. The pixel rendering algorithm can compensate for color representation that each of the pixels PIX1 and PIX2 lacks with an average value of color data of neighboring pixels.

Referring to FIG. 4, the image-capturing area CA includes pixel groups PG which are a certain distance apart from each other and light-transmitting portions AG disposed between the neighboring pixel groups PG. External light is incident on a lens of a sensor module through the light-transmitting portions AG. The light-transmitting portions AG can include transparent media with high transmissivity without a metal so that light can be incident with the minimum optical loss. In other words, the light-transmitting portions AG may not include metal interconnections or pixels and can be made of transparent insulating materials. Due to the light-transmitting portions AG, the image-capturing area CA can have lower PPI than the display area DA. The larger the light-transmitting portions AG, the higher the transmissivity of the image-capturing area CA.

The pixel groups PG in the image-capturing area CA can include one or two pixels. Each of the pixels of the pixel groups PG can include two to four subpixels. For example, one pixel in the pixel group PG can include R, G, and B subpixels or two subpixels and can further include a W subpixel. In the example of FIG. 4, the first pixel PIX1 can include R and G subpixels, and the second pixel PIX2 includes B and G subpixels. However, the first and second pixels PIX1 and PIX2 are not limited to the example.

In FIG. 4, the light-transmitting portions AG are shown as a circular shape but are not limited thereto. For example, the light-transmitting portions AG can be designed as various shapes such as a circle, an oval, and a polygon.

To minimize optical loss, all metal electrode materials can be removed from the light-transmitting portions AG. According to a display panel manufacturing method, a metal used for a cathode can be evenly deposited on the entire screen, and then the cathode layer can be removed from the light-transmitting regions of the image-capturing area CA in a laser ablation process. The laser ablation process will be described in detail below.

A specific arrangement of light-transmitting portions will be described below with reference to FIGS. 5 to 7.

Figure 5:
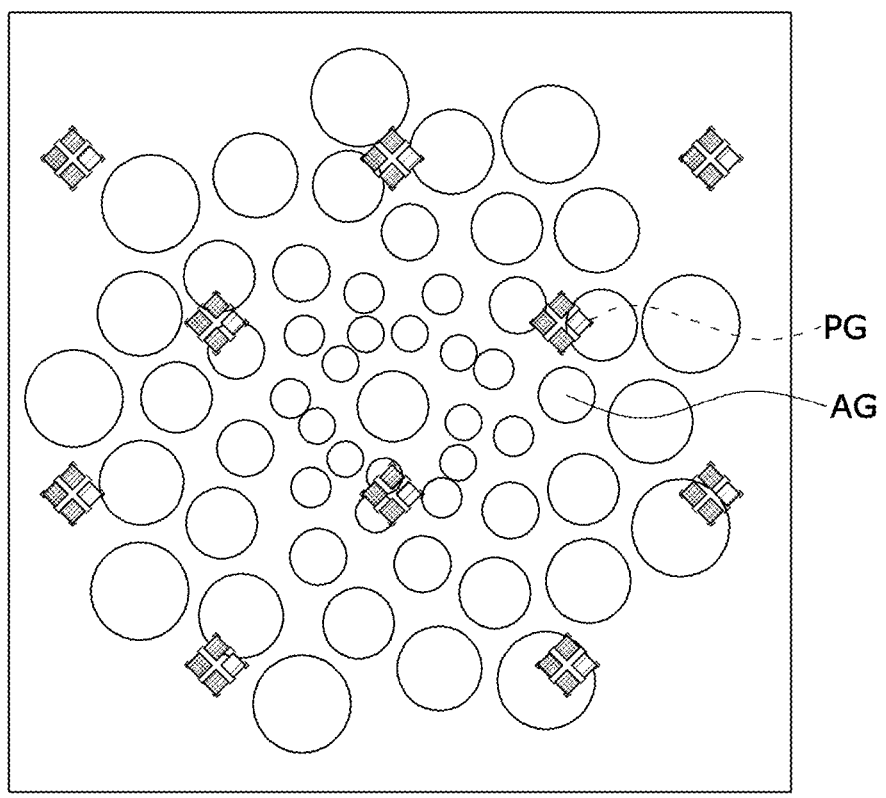
FIG. 5 is a diagram showing an arrangement of light-transmitting portions (AG) and pixel groups (PG)

FIG. 5 is a diagram showing an arrangement of the light-transmitting portions AG and the pixel groups PG.

Figure 6:
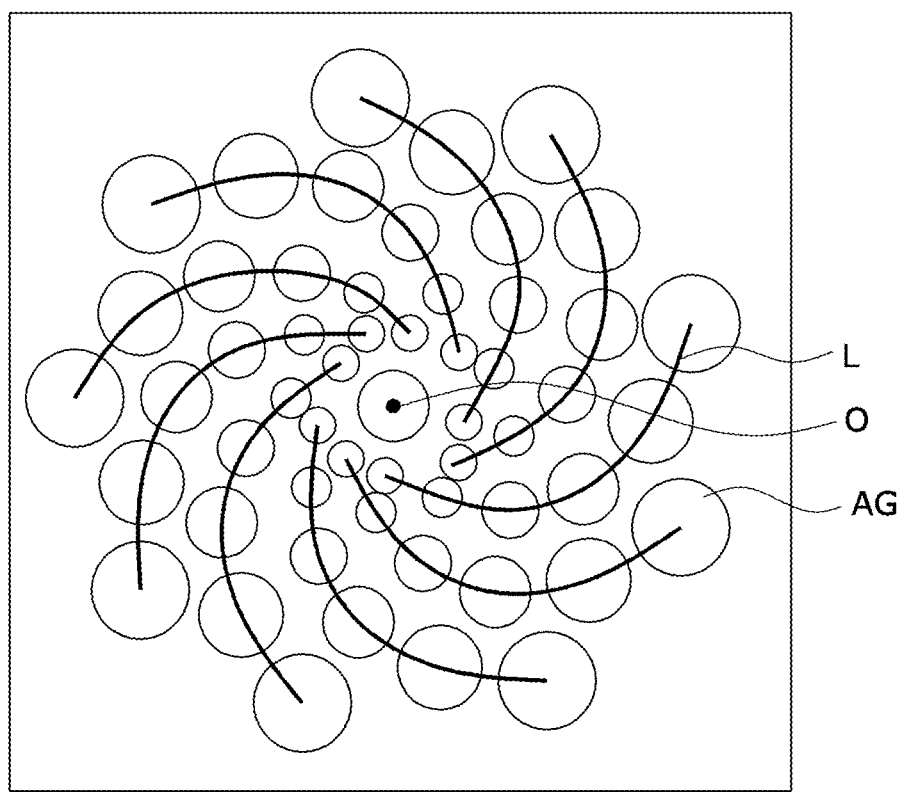
FIG. 6 is a diagram illustrating an arrangement of the light-transmitting portions (AG) in FIG. 5.

FIG. 6 is a diagram illustrating an arrangement of the light-transmitting portions AG in FIG. 5.

Figure 7:
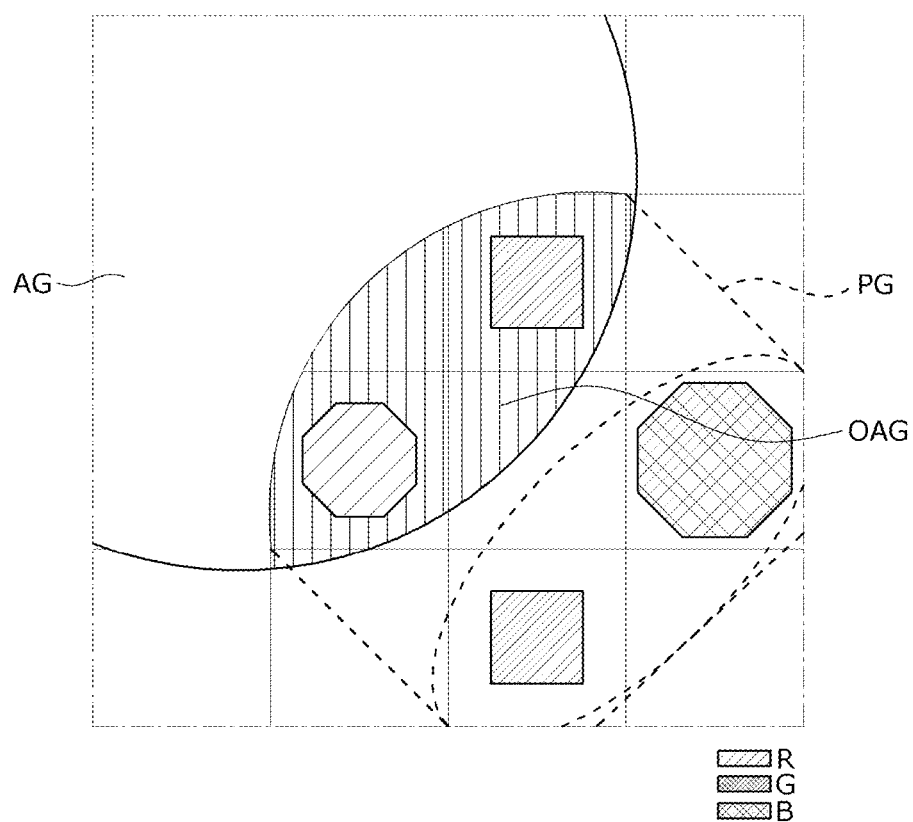
FIG. 7 is a diagram showing a part of FIG. 5 in which the light-transmitting portion (AG) and the pixel group (PG) overlap.

FIG. 7 is a diagram showing a part of FIG. 5 in which the light-transmitting portion AG and the pixel group PG overlap.

Referring to FIG. 5, the display panel according to the embodiment can include the pixel groups PG which are regularly arranged and the light-transmitting portions AG which are randomly disposed. The pixel groups PG can be regularly arranged at regular intervals. The light-transmitting portions AG can be disposed between the pixel groups PG. The light-transmitting portions AG can partially overlap the pixel groups PG.

As shown in FIG. 6, the light-transmitting portions AG can be randomly arranged on the basis of a center O of the image-capturing area. As an embodiment, the light-transmitting portions AG can be arranged along a Fibonacci spiral L based on the center O of the image-capturing area. Each Fibonacci spiral L is a virtual line for guiding the arrangement of the light-transmitting portions AG and may not be actually seen in the product. Distances from the start points of Fibonacci spirals L to the center O of the image-capturing area can differ from each other. Further, the light-transmitting portions AG formed along the Fibonacci spirals L can have a larger diameter as they are disposed farther away from the center O, but the diameters of the light-transmitting portions AG are not limited thereto. The light-transmitting portions AG can have a circular shape but are not limited thereto as described above.

The Fibonacci equation is $(x, y) = [a\sqrt{n}\cos(nb), a\sqrt{n}\sin(nb)]$. Here, a is an arbitrary positive real number, n is a positive integer, and b is a constant value of 137.5°.

Referring to FIG. 7, the light-transmitting portions AG can include overlapping regions OAG which overlap the pixel groups PG. Metal materials present in the hatched overlapping region OAG of FIG. 7 may not be removed. In other words, a metal material of the cathode and the like may not be removed from the overlapping region OAG for light emission. When a metal material, such as the cathode layer, is removed, light is not emitted. Metal materials can be removed through a laser ablation process which will be described below.

A process of forming light-transmitting portions will be described below with reference to FIGS. 8 to 11. As an example, a process of forming light-transmitting portions through a laser ablation process will be described below, but the present disclosure is not limited thereto.

Figure 8:
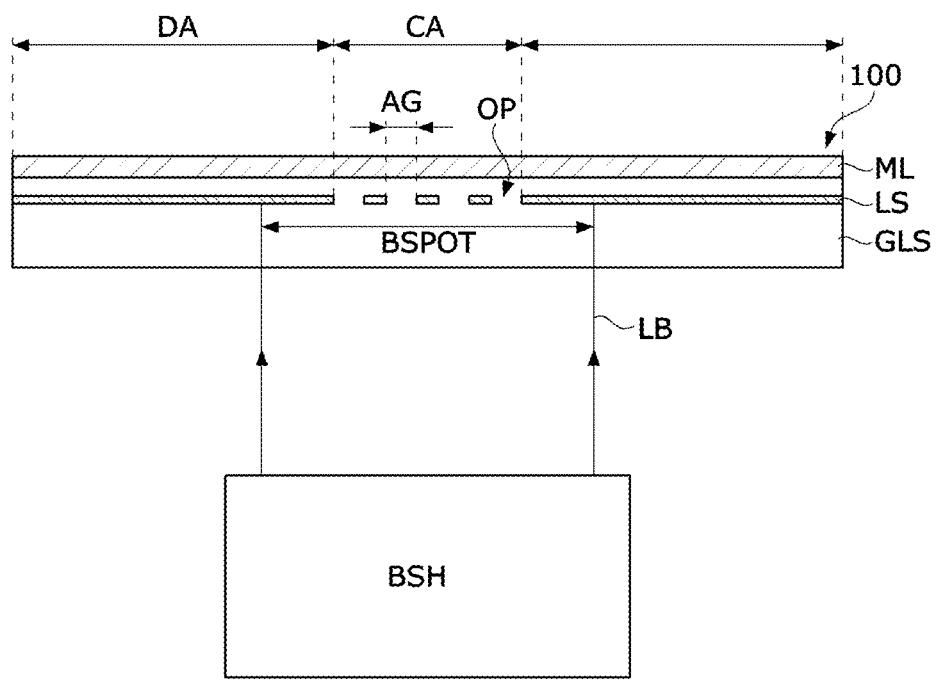
FIG. 8 is a diagram showing a cross-sectional structure of the display panel and a laser beam emitted in a laser ablation process according to the embodiment of the present disclosure.

FIG. 8 is a diagram showing a cross-sectional structure of the display panel 100 and a laser beam emitted in a laser ablation process according to the embodiment of the present disclosure.

Referring to FIG. 8, the display panel 100 includes a light shield layer LS which blocks a laser beam and a metal layer ML which is exposed to the laser beam through open pores OP obtained by removing the light shield layer LS.

The light shield layer LS is deposited on all of the display area DA and the image-capturing area CA and then patterned in a photolithography process. The light shield layer LS is formed on all of the display area DA and the image-capturing area CA or at least the pixel regions of the display area DA and the image-capturing area CA and is removed from open pore regions, which expose the light-transmitting portions AG of the image-capturing area CA, to define the open pores OP. The open pores OP may not be formed in the overlapping regions OAG of the light shield layer LS shown in FIG. 7, for example, a region in which the light-transmitting portion AG and the pixel group PG overlap. This is because the metal layer ML should not be removed from the overlapping regions OAG. The pixel region means a region in which the pixels PIX1 and PIX2 are arranged in each of the display area DA and the image-capturing area CA.

The metal layer ML is any one of metal layers required for pixel driving of the display panel 100 and should be removed from the light-transmitting portions AG of the image-capturing area CA. For example, the metal layer ML can be formed in a cathode material layer or another layer. When the metal layer ML is a metal that should be partially removed in the laser ablation process, the wavelength of the laser beam LB is determined in a wavelength band in which the metal has a high absorption coefficient.

The light shield layer LS protects the metal layer ML present in the screen excluding the light-transmitting regions of the image-capturing area CA from the laser beam LB generated in the laser ablation process. To this end, the metal layer ML is selected from materials which have a low absorption coefficient at the wavelength of the laser beam LB.

When the metal layer ML is an Mg—Ag alloy thin-film layer which is used as a cathode material, Mg has a high absorption coefficient at a wavelength of 1,064 nm. On the other hand, amorphous silicon (a-Si) or molybdenum (Mo) has a low absorption coefficient at the wavelength of 1,064 nm. Accordingly, when Mg—Ag alloy thin-film layer is removed with the laser beam LB having the wavelength of 1,064 nm, the light shield layer LS for protecting the Mg—Ag alloy layer in the region excluding the lighting-transmitting regions from the laser beam LB includes a material having a low absorption coefficient at the wavelength of 1,064 nm such as a-Si or Mo.

Due to the light shield layer LS formed in the display panel 100, the laser beam LB can be emitted in the form of a line beam or block beam in the laser ablation process. The length of the line beam or block beam is larger than the image-capturing area CA. A beam spot BSPOT of the laser beam LB emitted to the display panel 100 in the form of a line beam or block beam can be longer than the image-capturing area CA in at least one direction (the X axis or Y axis). When the beam spot BSPOT is larger than the image-capturing area CA, only parts of the metal layer ML in the light-transmitting regions are exposed to the laser beam LB through the open pores OP in which the light shield layer LS is not present, and the metal layer ML in the other region covered by the light shield layer LS can be protected from the laser beam LB.

A laser ablation device can generate a line-shaped or block-shaped beam of uniform intensity using a beam shaper (or beam homogenizer) BSH. A line beam or block beam can be generated according to the structure of the beam shaper BSH, and the size of the laser beam LB can be adjusted according to the distance between the beam shaper BSH and the substrate 10 of the display panel 100.

When the laser beam LB is emitted to the entire image-capturing area CA in the laser ablation process using the light shield layer LS formed in the display panel 100, the metal layer ML can be simultaneously and completely removed from the light-transmitting portions AG in the image-capturing area CA. Here, the metal layer ML present in the pixel array excluding the light-transmitting portions AG is protected from the laser beam LB by the light shield layer LS and thus is not removed in the laser ablation process. The metal layer ML can be removed only from the light-transmitting portions AG of the image-capturing area CA in the screen by emitting the laser beam LB only once. Accordingly, the present disclosure can minimize laser ablation process time and minimize the margin between the display area DA and the image-capturing area CA. Further, since the metal layer ML is completely removed from the light-transmitting portions AG without any residual film, the present disclosure can increase the transmissivity of the image-capturing area CA and reduce noise in the data of a captured image.

Figure 9:
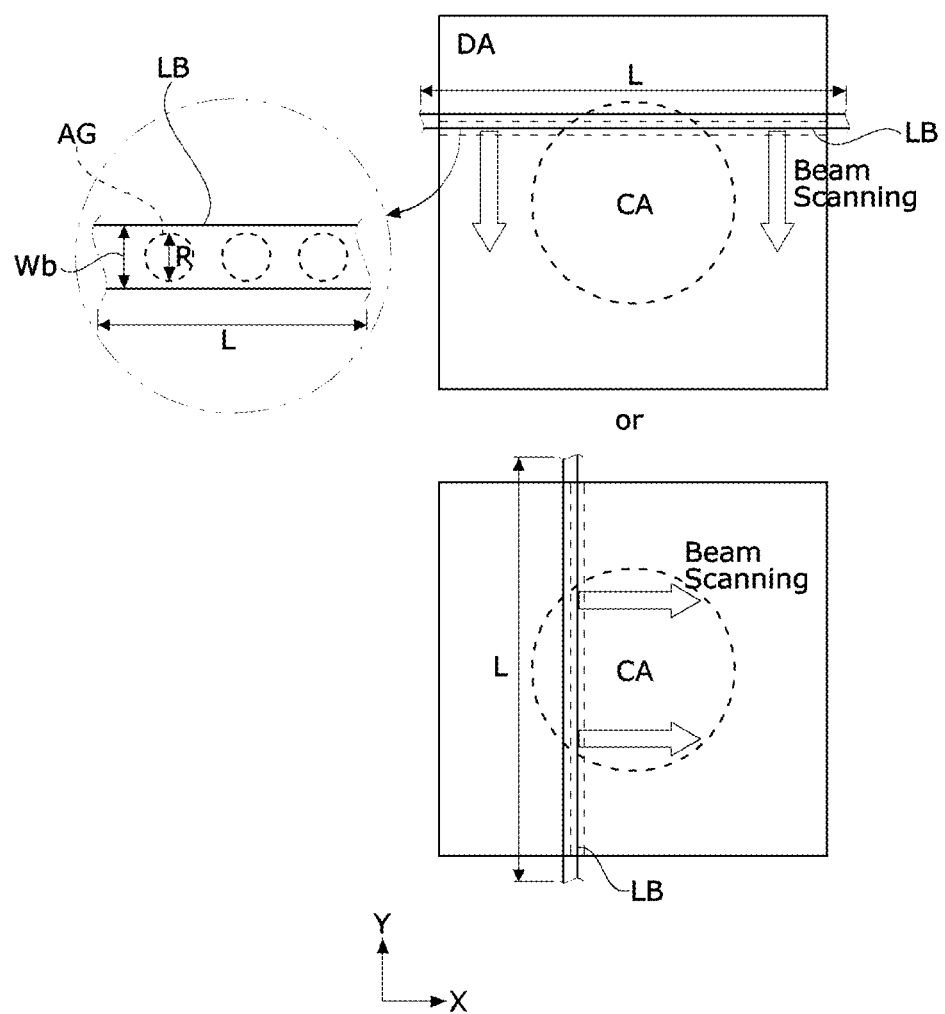
FIGS. 9 to 11 are diagrams showing various laser beam spots according to the embodiment of the present disclosure.
Figure 10:
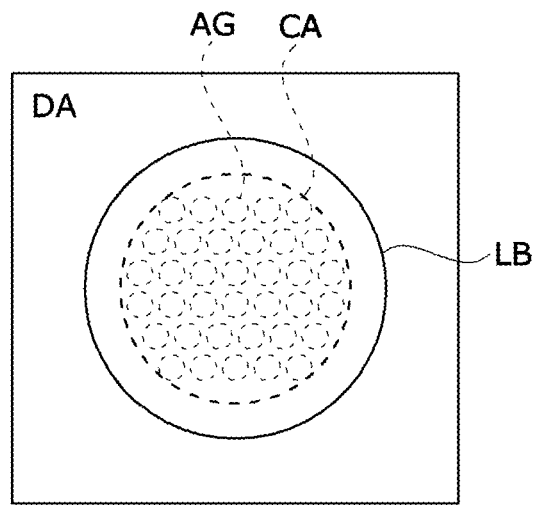
Figure 10:
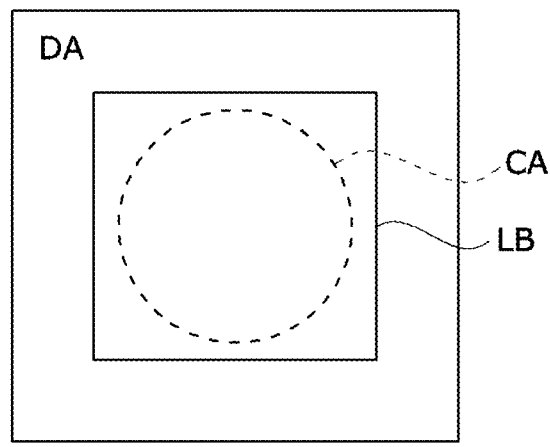
Figure 11:
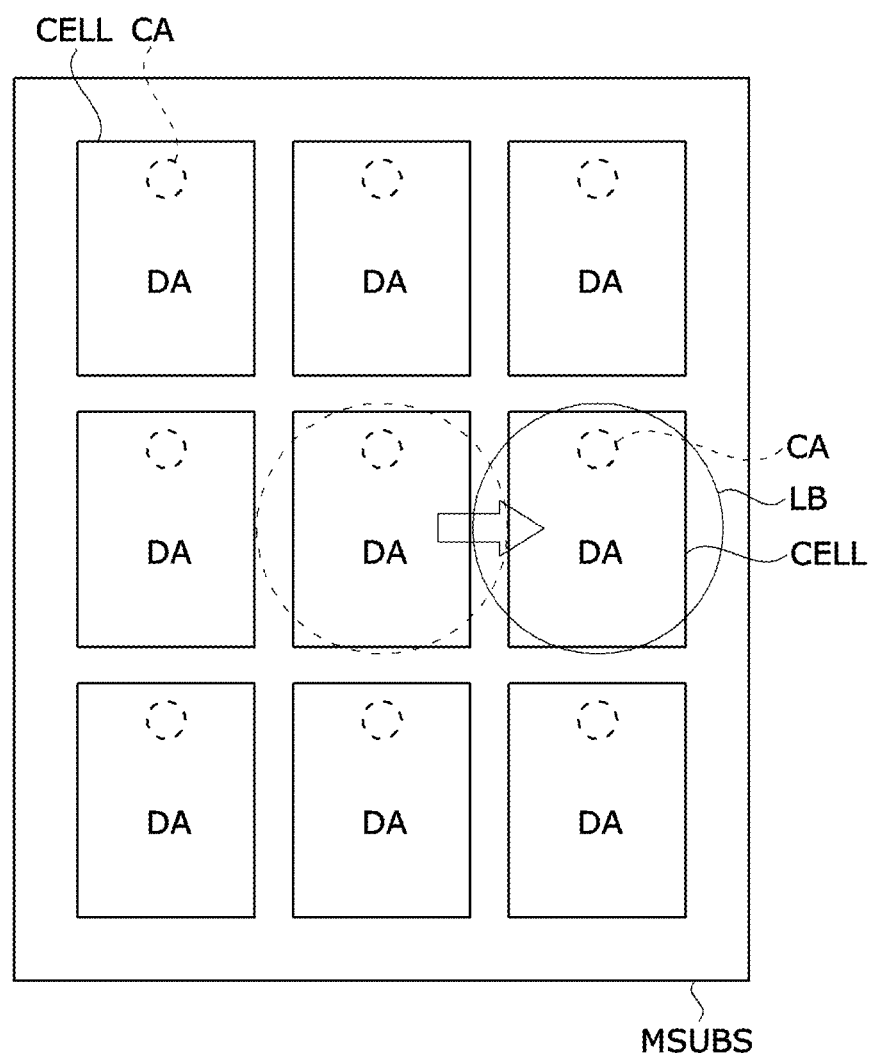

FIGS. 9 to 11 are diagrams showing various laser beam spots according to the embodiment of the present disclosure.

Referring to FIG. 9, in the laser ablation process, the laser beam LB is emitted in the form of a line beam which traverses the image-capturing area CA. Since only the metal layer ML exposed to the laser beam LB through the open pores OP in which the light shield layer LS is not present is removed, the laser beam LB is allowed to be sufficiently long. A width Wb of the laser beam LB can be larger than the diameters or maximum length of the light-transmitting portions AG and further can be the diameter or maximum length of the image-capturing area CA or more.

A length L of the laser beam LB can be greater than or equal to the maximum length of the image-capturing area CA. The laser beam LB emitted to the display panel 100 in the form of a line beam scans the display panel 100 while being moved in a first direction (the X-axis or Y-axis direction). The laser beam LB has a large beam spot and thus can be emitted not only to the image-capturing area CA but also to a part of the display area DA close to the image-capturing area CA or the entire display area DA. While the laser beam LB moves in the first direction, the laser beam LB of a previous shot and the laser beam LB of a current shot can overlap at least partially so that any residual metal film may not remain in the light-transmitting portions AG of the image-capturing area CA.

After scanning the display panel 100 in the first direction (the X-axis or Y-axis direction), the laser beam LB can scan the display panel 100 in a second direction (the X-axis or Y-axis direction) to remove the metal layer ML only from the light-transmitting regions so that residual films can be completely removed. Since the metal layer ML is a thin film, the metal layer ML can generally be removed without any residual film by laser scanning in only one direction.

Referring to FIG. 10, in the laser ablation process, the laser beam LB can be emitted as a block beam having a larger size than the light-transmitting portions AG, and further, the image-capturing area CA. Since the laser beam LB emitted in the form of a block beam has a large beam spot, a single shot of the laser beam LB is emitted to all the light-transmitting portions AG, and further, emitted to the entire image-capturing area CA. The beam spot of the block beam covers the entire image-capturing area CA, and thus a selected metal layer, for example, the cathode, can be removed from all the light-transmitting portions AG of the image-capturing area CA by a single shot of the laser beam LB.

The shape, size, etc. of the block beam is determined by the beam shaper BSH, and the intensity of the laser beam LB is uniform in the block. The block beam can be a circular beam or a quadrangular beam but is not limited to a specific shape.

Since only the metal layer ML exposed to the laser beam LB through the open pores OP is removed, the laser beam LB can have a large size. For example, a block-shaped laser beam directed toward the display panel 100 can be emitted not only to the image-capturing area CA but also to at least a part of the display area DA close to the image-capturing area CA or the entire display area DA. Therefore, the metal layer ML of all the light-transmitting portions AG can be removed from the screen by only a single shot of the laser beam LB.

Referring to FIG. 11, a plurality of display panels 100 can be simultaneously manufactured through a multi-panel process.

A process of forming a thin film is simultaneously performed on a plurality of cells CELL on a mother substrate MSUBS. Here, one cell is a single product of the display panel 100. The circuit layers 12 of the cells CELL are simultaneously formed on the mother substrate MSUBS. The circuit layers 12 include the light shield layers LS which expose light-transmitting regions. When a metal is removed from the circuit layers 12 formed in the light-transmitting regions, a laser ablation process can be performed.

In the manufacturing process of the circuit layers 12, after the anode of light-emitting elements OLED are formed, organic compound layers of the light-emitting element layers 14 begin to be deposited, and the light-emitting element layers of the cells CELL are simultaneously formed on the mother substrate MSUBS. After the light-emitting element layers 14 are coated with protection films and encapsulation layers, the mother substrate MSUBS is cut by a scribing wheel along a scribing line in a scribing process, and thus the mother substrate MSUBS is divided into the cells CELL. After the scribing process, the contour of each of the display panels 100 is trimmed by laser cutting equipment in a trimming process.

In the laser ablation process, the laser beam LB can be emitted onto the mother substrate MSUBS in the form of a line beam or a block beam. Here, the beam spot can have a larger size than the light-transmitting portions AG of the image-capturing area CA. Further, the size of the beam spot can completely cover the image-capturing area CA or can be larger to cover the unit cell CELL.

Merits of the light-transmitting portion arrangement according to the embodiment of the present disclosure will be described below with reference to FIGS. 12 and 13.

Figure 12:
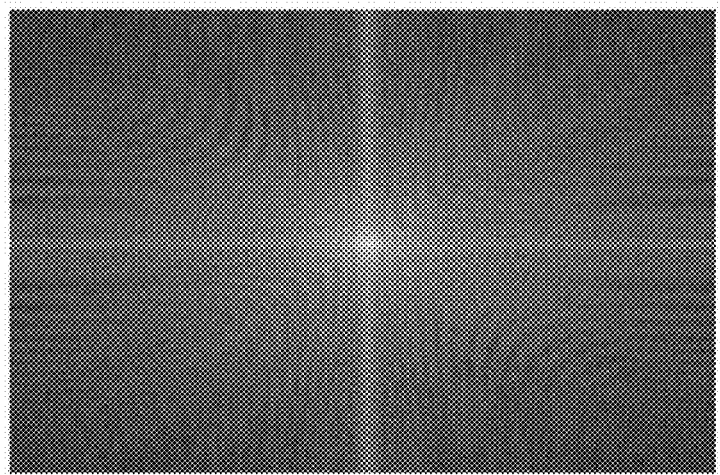
FIG. 12 is a picture of a captured image in which interference fringes appear.

FIG. 12 is a picture of a captured image in which interference fringes appear.

Figure 13:
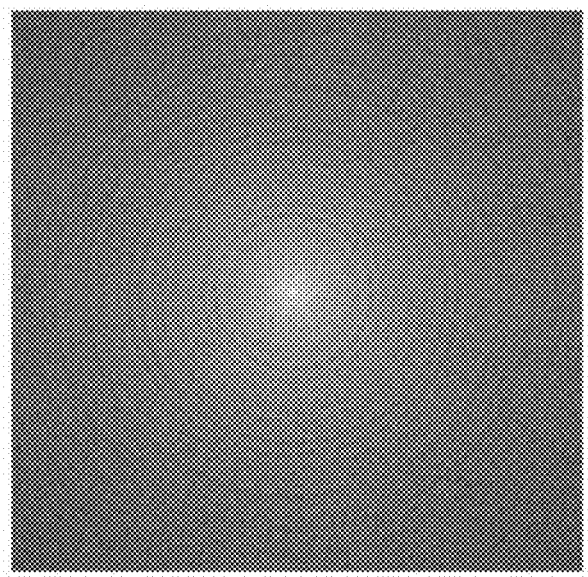
FIG. 13 is a picture of a captured image from which interference fringes are removed.

FIG. 13 is a picture of a captured image from which interference fringes are removed.

Referring to FIG. 12, when a general light-transmitting portion arrangement, for example, a regular light-transmitting portion arrangement, is employed in an image-capturing area, interference fringes can appear in a captured image as shown in the drawing. This can be a problem resulting from regular optical path differences due to the regular light-transmitting portion arrangement.

Referring to FIG. 13, when light-transmitting portions are randomly arranged, more specifically, randomly arranged using the Fibonacci sequence, optical paths of external light incident on an imaging module are randomly distributed by the light-transmitting portions which are randomly arranged so that no interference fringes can appear. Accordingly, when the light-transmitting portion arrangement according to the embodiment of the present disclosure is used, a ghost image or interference fringes can be removed, and thus it is possible to improve the quality of a captured image.

Figure 14:
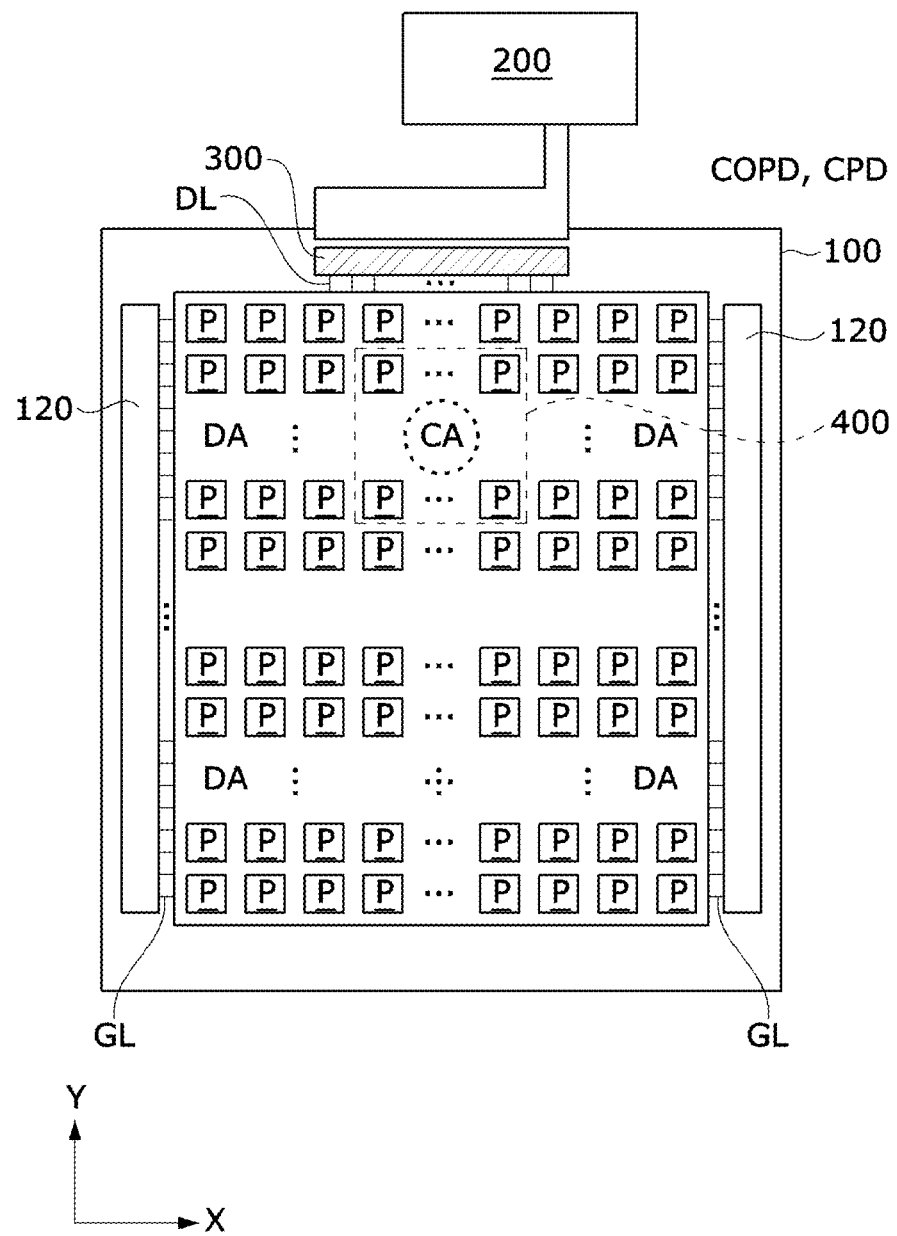
FIG. 14 is a block diagram showing a display panel and a display panel driver according to an embodiment of the present disclosure.
Figure 15:
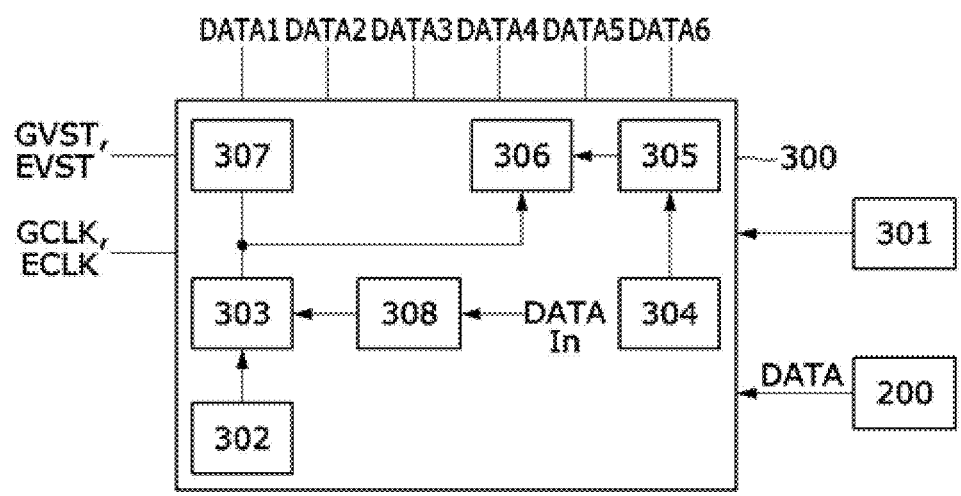
FIG. 15 is a block diagram schematically showing a configuration of a drive integrated circuit (IC)

FIG. 14 is a block diagram showing a display panel and a display panel driver according to an embodiment of the present disclosure. FIG. 15 is a block diagram schematically showing a configuration of a drive integrated circuit (IC).

Referring to FIGS. 14 and 15, the display device includes a display panel 100 having a screen on which a pixel array is disposed, a display panel driver, and the like.

The pixel array of the display panel 100 includes data lines DL, gate lines GL crossing the data lines DL, and pixels P arranged in a matrix form defined by the data lines DL and the gate lines GL. The pixel array further includes power lines such as a VDD line PL1, a Vini line PL2, and a VSS line PL3 shown in FIG. 16.

The pixel array can be divided into the circuit layer 12 and the light-emitting element layer 14 as shown in FIG. 1. A touch sensor array can be disposed on the light-emitting element layer 14. Each of the pixels in the pixel array can include two to four subpixels as described above. Each of the subpixels includes a pixel circuit disposed in the circuit layer 12.

The screen of the display panel 100 in which an input image is displayed includes a display area DA and an image-capturing area CA.

Subpixels in each of the display area DA and the image-capturing area CA include pixel circuits. The pixel circuit can include a driving element which supplies a current to a light-emitting element, a plurality of switch elements which sample a threshold voltage of the driving element and switch a current path of the pixel circuit, a capacitor which maintains a gate voltage of the driving element, and the like. The pixel circuit is disposed under the light-emitting element.

The image-capturing area CA includes light-transmitting portions AG disposed between pixel groups and an imaging element module 400 disposed under the image-capturing area CA. In the image-capturing mode, the imaging element module 400 photoelectrically converts light incident through the image-capturing area CA using an image sensor, converts pixel data of an image output from the image sensor into digital data, and outputs the captured image data.

The display panel driver writes the pixel data of the input image to the pixels P. The pixels P can be understood as a pixel group including a plurality of subpixels.

The display panel driver includes a data driver 306 which supplies data voltages of the pixel data to the data lines DL and a gate driver 120 which supplies a gate pulse to the gate lines GL in sequence. The data driver 306 can be integrated into a drive IC 300. The display panel driver can further include a touch sensor driver.

The drive IC 300 can adhere onto the display panel 100. The drive IC 300 receives the pixel data of the input image and a timing signal from a host system 200, supplies the data voltages of the pixel data to the pixels P, and synchronizes the data driver 306 and the gate driver 120 with each other.

The drive IC 300 is connected to the data lines DL through data output channels and supplies the data voltages of the pixel data to the data lines DL. The drive IC 300 can output gate timing signals for controlling the gate driver 120 through gate timing signal output channels. The gate timing signals generated by a timing controller 303 can include a gate start pulse GVST, a gate shift clock GCLK, and the like. The gate start pulse GVST and the gate shift clock GCLK swing between a gate-on voltage VGL and a gate-off voltage VGH. The gate timing signals GVST and GCLK output from a level shifter 307 are applied to the gate driver 120 and control a shift operation of the gate driver 120.

The gate driver 120 can include a shift register formed in the circuit layer 12 of the display panel 100 together with the pixel array. The shift register of the gate driver 120 sequentially supplies gate signals to the gate lines GL under the control of the timing controller 303. The gate signals can include a scan pulse and the electromagnetic (EM) pulse of a light-emitting signal. The shift register can include a scan driver which outputs the scan pulse and an EM driver which outputs the EM pulse. In FIG. 15, GVST and GCLK indicate the gate timing signals input to the scan driver. EVST and ECLK indicate gate timing signals input to the EM driver.

The drive IC 300 can be connected to the host system 200, a first memory 301, and the display panel 100. The drive IC 300 can include a data reception and computation part 308, the timing controller 303, the data driver 306, a gamma compensation voltage generator 305, a power supply 304, a second memory 302, and the like.

The data reception and computation part 308 includes a receiver which receives the pixel data input as a digital signal from the host system 200 and a data computation part which processes the pixel data input through the receiver to improve image quality. The data computation part can include a data restoration part which restores the pixel data by decoding compressed pixel data, an optical compensator which adds a preset optical compensation value to the pixel data, and the like. The optical compensation value can be set to a value for correcting the brightness of each piece of the pixel data on the basis of the brightness of the screen measured on the basis of a camera image captured in the manufacturing process.

The timing controller 303 provides the pixel data of the input image received from the host system 200 to the data driver 306. The timing controller 303 controls operation timings of the gate driver 120 and the data driver 306 by generating the gate timing signals for controlling the gate driver 120 and a source timing signal for controlling the data driver 306.

The data driver 306 converts digital data including the pixel data received from the timing controller 303 into a gamma compensation voltage through a digital-to-analog converter (DAC) and outputs data voltages. The data voltages output from the data driver 306 are supplied to the data lines DL of the pixel array through an output buffer connected to the data channel of the drive IC 300.

The gamma compensation voltage generator 305 generates grayscale-specific gamma compensation voltages by dividing a gamma reference voltage from the power supply 304 through a voltage divider circuit. The gamma compensation voltages are analog voltages set according to grayscale levels of the pixel data. The gamma compensation voltages output from the gamma compensation voltage generator 305 are provided to the data driver 306.

The power supply 304 generates power required for driving the pixel array of the display panel 100, the gate driver 120, and the drive IC 300 using a direct current (DC)-DC converter. The DC-DC converter can include a charge pump, a regulator, a buck converter, a boost converter, and the like. The power supply 304 can generate DC power, such as the gamma reference voltage, the gate-on voltage VGL, the gate-off voltage VGH, a pixel driving voltage VDD, a low-potential power voltage VSS, and an initialization voltage Vini, by adjusting a DC input voltage from the host system 200. The gamma reference voltage is supplied to the gamma compensation voltage generator 305. The gate-on voltage VGL and the gate-off voltage VGH are supplied to the level shifter 307 and the gate driver 120. The pixel power, such as pixel driving voltage VDD, the low-potential power voltage VSS, and the initialization voltage Vini, is supplied to the pixels P in common. The initialization voltage Vini is set to a DC voltage, which is lower than the pixel driving voltage VDD and a threshold voltage of the light-emitting elements OLED, initializes main nodes of the pixel circuits, and suppresses light emission of the light-emitting elements OLED.

The second memory 302 stores compensation values, register setting data, etc. received from the first memory 301 when the power is input to the drive IC 300. The compensation values can be applied to various algorithms for improving image quality. The compensation values can include the optical compensation value. The register setting data defines operations of the data driver 306, the timing controller 303, the gamma compensation voltage generator 305, and the like. The first memory 301 can include a flash memory. The second memory 302 can include a static random access memory (SRAM).

The host system 200 can be implemented as an application processor (AP). The host system 200 can transmit the pixel data of the input image to the drive IC 300 through a mobile industry processor interface (MIPI). The host system 200 can be connected to the drive IC 300 through, for example, a flexible printed circuit (FPC).

Meanwhile, the display panel 100 can be implemented as a flexible panel which is applicable to a flexible display. The screen size of the flexible display can be changed by rolling, folding, or bending the flexible panel, and the flexible display can be easily manufactured in various designs. The flexible display can be implemented as a rollable display, a foldable display, a bendable display, a slidable display, or the like. The flexible panel can be manufactured as a so-called "plastic OLED panel." The plastic OLED panel can include a back plate and a pixel array on an organic thin film bonded onto the back plate. The touch sensor array can be formed on the pixel array.

The back plate can be a polyethylene terephthalate (PET) substrate. The pixel array and the touch sensor array can be formed on the organic thin film. The back plate can prevent moisture infiltration into the organic thin film so that the pixel array may not be exposed to moisture. The organic thin film can be a polyimide (PI) substrate. A multilayer buffer film can be made of insulating materials on the organic thin film. The circuit layer 12 and the light-emitting element layer 14 can be stacked on the organic thin film.

In the display device of the present disclosure, the pixel circuits disposed in the circuit layer 12, the gate driver 120, etc. can include a plurality of transistors. The transistors can be implemented as an oxide TFT including an oxide semiconductor, a low-temperature polysilicon (LTPS) TFT including LTPS, or the like. Each of the transistors can be implemented as a p-channel TFT or an re-channel TFT. In the embodiment, an example in which the transistors of the pixel circuit are implemented as p-channel TFTs is mainly described, but the present disclosure is not limited thereto.

A transistor is a three-electrode element including a gate, a source, and a drain. The source is an electrode through which carriers are supplied to the transistor. In the transistor, the carriers begin to flow from the source. The drain is an electrode through which carriers move out of the transistor. In the transistor, carriers flow from the source to the drain. In the case of an n-channel transistor, carriers are electrons, and thus the source voltage is lower than the drain voltage. In the n-channel transistor, a current flows from the source to the drain. In the case of a p-channel transistor (p-channel metal-oxide semiconductor (PMOS)), carriers are holes, and thus the source voltage is higher than the drain voltage so that the holes can flow from the source to the drain. Since the holes flow from the source to the drain in the p-channel transistor, a current flows from the source to the drain. It should be noted that the source and the drain of a transistor are not fixed. For example, the source and the drain can be changed depending on an applied voltage. Consequently, the present disclosure is not limited by the source and the drain of a transistor. In the following description, the source and the drain of a transistor will be referred to as first and second electrodes.

A gate pulse swings between a gate-on voltage and a gate-off voltage. The gate-on voltage is set to a higher value than the threshold voltage of a transistor, and the gate-off voltage is set to a lower value than the threshold voltage of the transistor. The transistor is turned on in response to the gate-on voltage and turned off in response to the gate-off voltage. In the case of an n-channel transistor, the gate-on voltage can be a gate high voltage VGH, and the gate-off voltage can be a gate low voltage VGL. In the case of a p-channel transistor, the gate-on voltage can be a gate low voltage VGL, and the gate-off voltage can be a gate high voltage VGH.

The driving element of the pixel circuit can be implemented as a transistor. The driving elements of all pixels should have the same electrical characteristics. However, their electrical characteristics can differ from each other due to process deviations or element characteristic deviations and can vary over the display operating time. To compensate for such electrical characteristic deviations of the driving elements, the display device can include an internal compensation circuit and an external compensation circuit. The internal compensation circuit is added to a pixel circuit in each subpixel to sample a threshold voltage Vth and/or a mobility μ of a driving element, which vary according to electrical characteristics of the driving element, and compensate for variations in the threshold voltage Vth and/or the mobility μ in real time. The external compensation circuit transmits a threshold voltage and/or a mobility of a driving element, which are sensed through a sensing line connected to each subpixel, to an external compensator. The compensator of the external compensation circuit modulates the pixel data of the input image to reflect sensing results and thereby compensates for electrical characteristics of the driving elements. The external compensation circuit senses a voltage of the pixel varying according to electrical characteristics of the driving element, and modulates the data of the input image on the basis of the sensed voltage so that electrical characteristic deviations of the driving elements of the pixels can be compensated.

Figure 16:
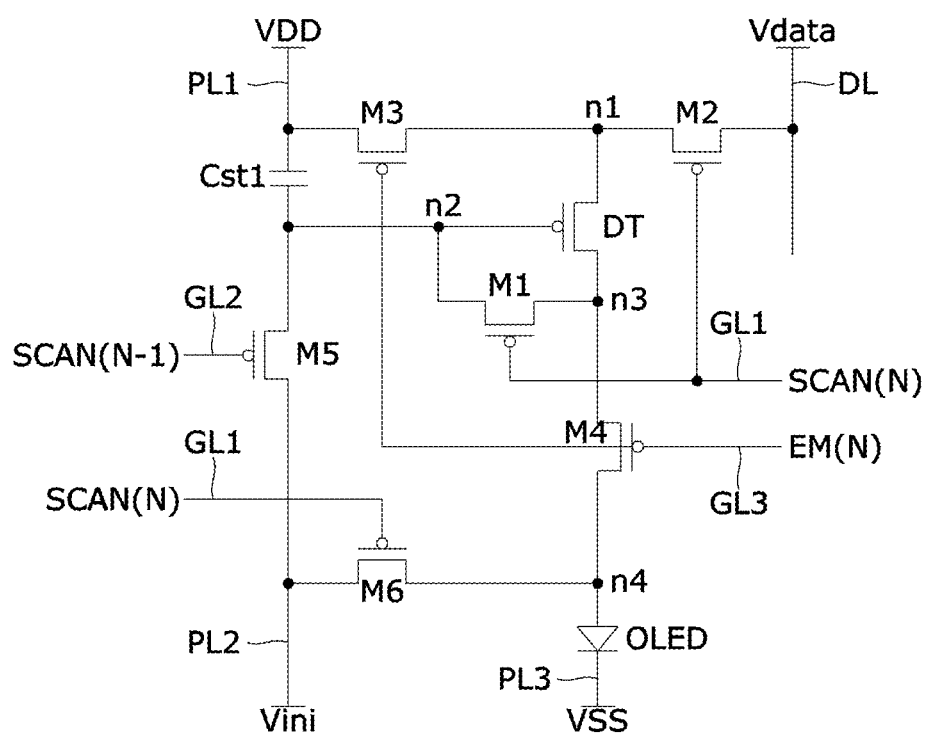
FIG. 16 is a circuit diagram showing an example of a pixel circuit.
Figure 17:
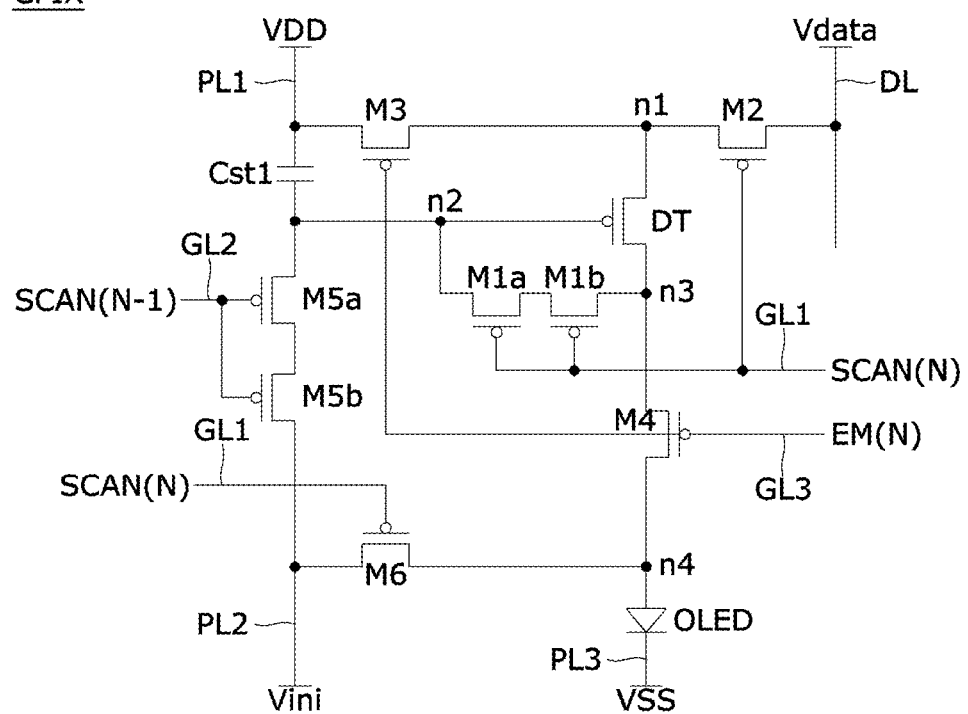
FIG. 17 is a circuit diagram showing another example of a pixel circuit.
Figure 18:
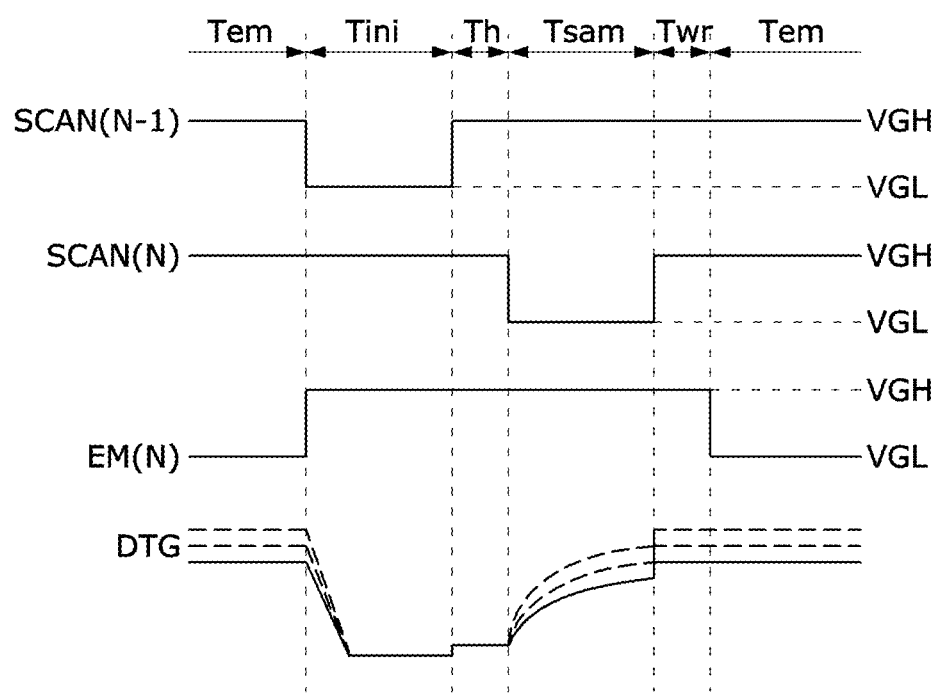
FIG. 18 is a timing diagram illustrating an operating method of the pixel circuits shown in FIGS. 16 and 17.

FIGS. 16 and 17 are circuit diagrams showing examples of a pixel circuit to which an internal compensation circuit is applied. FIG. 18 is a timing diagram illustrating an operating method of the pixel circuits shown in FIGS. 16 and 17. It should be noted that the pixel circuit of the present disclosure is not limited to FIGS. 16 and 17. Pixel circuits shown in FIGS. 16 and 17 can be applied to the pixel circuits of the display area DA and the image-capturing area CA in common. A pixel circuit applicable to the present disclosure can be implemented as the circuits shown in FIGS. 16 and 17 but is not limited thereto.

Referring to FIGS. 16 to 18, a pixel circuit includes a light-emitting element, a driving element DT which supplies a current to the light-emitting element, and an internal compensation circuit which samples the threshold voltage Vth of the driving element DT using a plurality of switch elements M1 to M6 and compensates for the gate voltage of the driving element DT by the threshold voltage Vth of the driving element DT. Each of the driving element DT and the switch elements M1 to M6 can be implemented as a p-channel TFT.

As shown in FIG. 18, the operating period of the pixel circuit employing an internal compensation circuit can be divided into an initialization period Tini, a sampling period Tsam, a data write period Twr, and an emission period Tem.

During the initialization period Tini, an (N−1)th scan signal SCAN(N−1) is generated as the pulse of the gate-on voltage VGL, and the voltage of each of the Nth scan signal SCAN(N) and an emission signal EM(N) is the gate-off voltage VGH. During the sampling period Tsam, the Nth scan signal SCAN(N) is generated as the pulse of the gate-on voltage VGL, and the voltage of each of the (N−1)th scan signal SCAN(N−1) and the emission signal EM(N) is the gate-off voltage VGH. During the data write period Twr, the voltage of each of the (N−1)th scan signal SCAN(N−1), the Nth scan signal SCAN(N), and the emission signal EM(N) is the gate-off voltage VGH. During at least a part of the emission period Tem, the emission signal EM(N) is generated at the gate-on voltage VGL, and the voltage of each of the (N−1)th scan signal SCAN(N−1) and the Nth scan signal SCAN(N) is generated at the gate-off voltage VGH.

During the initialization period Tini, the fifth switch element M5 is turned on according to the gate-on voltage VGL of the (N−1)th scan signal SCAN(N−1) to initialize the pixel circuit. During the sampling period Tsam, the first and second switch elements M1 and M2 are turned on according to the gate-on voltage VGL of the Nth scan signal SCAN(N), and thus the threshold voltage of the driving element DT is sampled and stored in a capacitor Cst1. Further, the sixth switch element M6 is turned on during the sampling period Tsam, and thus the voltage of a fourth node n4 is lowered to a reference voltage Vref so that light emission of the light-emitting element can be suppressed. During the data write period Twr, the first to sixth switch elements M1 to M6 remain in their off state. During the emission period Tem, the third and fourth switch elements M3 and M4 are turned on so that the light-emitting element emits light. During the emission period Tem, to precisely represent the brightness of a low grayscale level with a duty ratio of the emission signal EM(N), the emission signal EM(N) swings between the gate-on voltage VGL and the gate-off voltage VGH at a certain duty ratio so that the third and fourth switch elements M3 and M4 can be repeatedly turned on and off.

The light-emitting element can be implemented as an OLED or an inorganic light-emitting diode. An example in which the light-emitting element is implemented as an OLED will be described below.

The light-emitting element (OLED) can include an organic compound layer formed between the anode and the cathode. The organic compound layer can include an HIL, an HTL, an EML, an ETL, and an EIL but is not limited thereto. When a voltage is applied to the anode and the cathode of the OLED, holes passing through the HTL and electrons passing through the ETL are moved to the EML and form excitons so that visible light is emitted from the EML.

The anode of the light-emitting element OLED is connected to the fourth node n4 between the fourth and sixth switch elements M4 and M6. The fourth node n4 is connected to the anode of the light-emitting element OLED, the second electrode of the fourth switch element M4, and the second electrode of the sixth switch element M6. The cathode of the light-emitting element OLED is connected to the VSS line PL3 to which the low-potential power voltage VSS is applied. The light-emitting element OLED emits light by a current Ids which flows according to a gate-source voltage Vgs of the driving element DT. The current path of the light-emitting element OLED is switched by the third and fourth switch elements M3 and M4.

The storage capacitor Cst1 is connected between the VDD line PL1 and a first node n1. The storage capacitor Cst1 is charged with a data voltage Vdata which is compensated for by the threshold voltage Vth of the driving element DT. Since the data voltage Vdata is compensated for by the threshold voltage Vth of the driving element DT in each subpixel, characteristic deviations of the driving elements DT in subpixels are corrected.

The first switch element M1 is turned on in response to the gate-on voltage VGL of the Nth scan pulse SCAN(N) and connects a second node n2 and a third node n3. The second node n2 is connected to the gate electrode of the driving element DT, the first electrode of the storage capacitor Cst1, and the first electrode of the first switch element M1. The third node n3 is connected to the second electrode of the driving element DT, the second electrode of the first switch element M1, and the first electrode of the fourth switch element M4. The gate electrode of the first switch element M1 is connected to a first gate line GL1 and supplied with the Nth scan pulse SCAN(N). The first electrode of the first switch element M1 is connected to the second node n2, and the second electrode of the first switch element M1 is connected to the third node n3.

During one frame period, the first switch element M1 is turned on for only a very short one horizontal period (1H) in which the Nth scan signal SCAN(N) is generated at the gate-on voltage VGL and thus remains in its off state for almost one frame period. Accordingly, in the off state of the first switch element M1, a leakage current can occur. To suppress the leakage current of the first switch element M1, the first switch element M1 can be implemented as a transistor with a dual gate structure in which two transistors M1a and M1b are connected in series as shown in FIG. 17.

The second switch element M2 is turned on in response to the gate-on voltage VGL of the Nth scan pulse SCAN(N) and supplies the data voltage Vdata to the first node n1. The gate electrode of the second switch element M2 is connected to the first gate line GL1 and supplied with the Nth scan pulse SCAN(N). The first electrode of the second switch element M2 is connected to the first node n1. The second electrode of the second switch element M2 is connected to a data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the emission signal EM(N) and connects the VDD line PL1 to the first node n1. The gate electrode of the third switch element M3 is connected to a third gate line GL3 and supplied with the emission signal EM(N). The first electrode of the third switch element M3 is connected to the VDD line PL1. The second electrode of the third switch element M3 is connected to the first node n1.

The fourth switch element M4 is turned on in response to the gate-on voltage VGL of the emission signal EM(N) and connects the third node n3 to the anode of the light-emitting element (OLED). The gate electrode of the fourth switch element M4 is connected to the third gate line GL3 and supplied with the emission signal EM(N). The first electrode of the fourth switch element M4 is connected to the third node n3, and the second electrode is connected to the fourth node n4.

The fifth switch element M5 is turned on in response to the gate-on voltage VGL of the (N−1)th scan pulse SCAN(N−1) and connects the second node n2 to the Vini line PL2. The gate electrode of the fifth switch element M5 is connected to the second gate line GL2 and supplied with the (N−1)th scan pulse SCAN(N−1). The first electrode of the fifth switch element M5 is connected to the second node n2, and the second electrode is connected to the Vini line PL2. To suppress the leakage current of the fifth switch element M5, the fifth switch element M5 can be implemented as a transistor with a dual gate structure in which two transistors M5a and M5b are connected in series as shown in FIG. 17.

The sixth switch element M6 is turned on in response to the gate-on voltage VGL of the Nth scan pulse SCAN(N) and connects the Vini line PL2 to the fourth node n4. The gate electrode of the sixth switch element M5 is connected to the first gate line GL1 and supplied with the Nth scan pulse SCAN(N). The first electrode of the sixth switch element M6 is connected to the Vini line PL2, and the second electrode is connected to the fourth node n4.

The driving element DT drives the light-emitting element OLED by adjusting the current Ids flowing to the light-emitting element OLED according to the gate-source voltage Vgs. The driving element DT includes a gate connected to the second node n2, a first electrode connected to the first node n1, and a second electrode connected to the third node n3.

During the initialization period Tini, the (N−1)th scan pulse SCAN(N−1) is generated at the gate-on voltage VGL. The Nth scan pulse SCAN(N) and the emission signal EM(N) remain at the gate-off voltage VGH during the initialization period Tini. Accordingly, during the initialization period Tini, the fifth switch element M5 is turned on, and the second and fourth nodes n2 and n4 are initialized to the initialization voltage Vini. A hold period Th can be set between the initialization period Tini and the sampling period Tsam. During the hold period Th, the gate pulses SCAN(N−1), SCAN(N), and EM(N) remain in their previous states.

During the sampling period Tsam, the Nth scan pulse SCAN(N) is generated at the gate-on voltage VGL. The Nth scan pulse SCAN(N) is synchronized with the data voltage Vdata of an Nth pixel line. The (N−1)th scan pulse SCAN(N−1) and the emission signal EM(N) remain at the gate-off voltage VGH during the sampling period Tsam. Accordingly, during the sampling period Tsam, the first and second switch elements M1 and M2 are turned on.

During the sampling period Tsam, a gate voltage DTG of the driving element DT is increased by a current flowing through the first and second switch element M1 and M2. When the driving element DT is turned off, the gate voltage DTG equals Vdata−|Vth|. In this case, the voltage of the first node n1 also equals Vdata−|Vth|. During the sampling period Tsam, the gate-source voltage Vgs of the driving element DT corresponds to |Vgs|=Vdata−|Vth|)=|Vth|.

During the data write period Twr, the Nth scan pulse SCAN(N) is inverted to the gate-off voltage VGH. The (N−1)th scan pulse SCAN(N−1) and the emission signal EM(N) remain at the gate-off voltage VGH during the data write period Twr. Accordingly, during the data write period Twr, all the switch elements M1 to M6 remain in their off state.

During the emission period Tem, the emission signal EM(N) can be generated at the gate-on voltage VGL. During the emission period Tem, to improve an ability to express a low grayscale level, the emission signal EM(N) can be turned on and off at a certain duty ratio and thus swing between the gate-on voltage VGL and the gate-off voltage VGH. During at least a part of the emission period Tem, the emission signal EM(N) can be generated at the gate-on voltage VGL.

When the emission signal EM(N) is at the gate-on voltage VGL, a current can flow between VDD and the light-emitting element (OLED) so that the light-emitting element (OLED) can emit light. During the emission period Tem, the (N−1)th and Nth scan pulses SCAN(N−1) and SCAN(N) remain at the gate-off voltage VGH. During the emission period Tem, the third and fourth switch element M3 and M4 are repeatedly turned on and off according to the voltage of the emission signal EM(N). When the emission signal EM(N) is at the gate-on voltage VGL, the third and fourth switch elements M3 and M4 are turned on so that a current flows to the light-emitting element (OLED). In this case, the gate-source voltage Vgs of the driving element DT corresponds to |Vgs|=VDD−(Vdata−|Vth|), and the current flowing to the light-emitting element (OLED) equals K(VDD−Vdata)$^2$. Here, K is a constant determined by a charge mobility of the driving element DT, a parasitic capacitance, a channel capacity, and the like.

Figure 19:
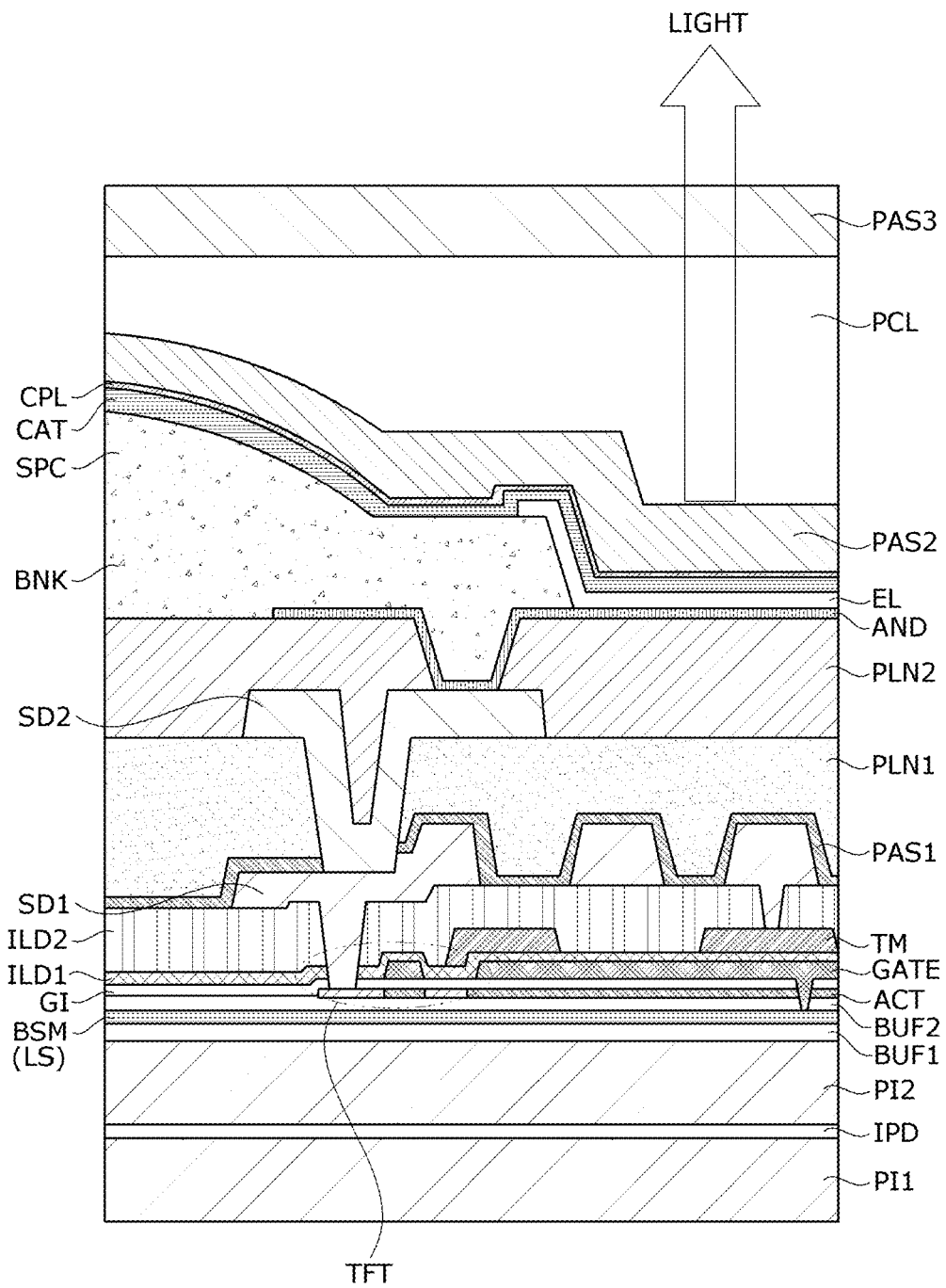
FIG. 19 is a cross-sectional view showing a structure of a pixel region in the display panel in detail according to the embodiment of the present disclosure.

FIG. 19 is a cross-sectional view showing a structure of the pixel region in the display panel in detail according to the embodiment of the present disclosure. It should be noted that the cross-sectional structure of the display panel 100 is not limited to FIG. 19. In FIG. 19, a TFT represents a driving element DT of a pixel circuit.

Referring to FIG. 19, the circuit layer 12, the light-emitting element layer 14, etc. can be stacked on substrates PI1 and PI2. The substrates PI1 and PI2 can include first and second PI substrates PI1 and PI2. An inorganic film IPD can be formed between the first PI substrate PI1 and the second PI substrate PI2. The inorganic film IPD prevents moisture infiltration.

A first buffer layer BUF1 can be formed on the second PI substrate PI2. The first buffer layer BUF1 can be formed as a multilayer insulation film in which two or more oxide (SiO$_2$) and nitride (SINx) films are stacked. A first metal layer can be formed on the first buffer layer BUF1, and a second buffer layer BUF2 can be formed on the first metal layer. The first metal layer is patterned in a photolithography process. The first metal layer can include a light shield pattern BSM. The light shield pattern BSM blocks external light so that an active layer of the TFT may not be irradiated, thereby preventing a photocurrent of the TFT formed in the pixel region. When the light shield pattern BSM is made of a metal having a lower absorption coefficient than the metal layer ML to be removed from the image-capturing area CA with respect to a laser wavelength used in the laser ablation process, the light shield pattern BSM can also serve as the light shield layer LS which blocks the laser beam LB in the laser ablation process.

Each of the first and second buffer layers BUF1 and BUF2 can be made of an inorganic insulating material and can include one or more insulating layers.

An active layer ACT can be made of a semiconductor material deposited on the second buffer layer BUF2 and patterned in a photolithography process. The active layer ACT includes active patterns of TFTs in the pixel circuit and a TFT in a gate driver. A part of the active layer ACT can be metalized by ion doping. The metalized part can be used as a jumper pattern which connects metal layers at some nodes in the pixel circuit and can connect elements of the pixel circuit.

A gate insulating layer GI can be formed on the second buffer layer BUF2 to cover the active layer ACT. The gate insulating layer GI can be made of an inorganic insulating material. A second metal layer can be formed on the gate insulating layer GI. The second metal layer can be patterned in a photolithography process. The second metal layer can include a gate line and gate electrode pattern GATE, a lower electrode of the storage capacitor Cst1, a jumper pattern which connects patterns of the first metal layer and the third metal layer, and the like.

A first interlayer insulating layer ILD1 can be formed on the gate insulating layer GI to cover the second metal layer. A third metal layer can be formed on the first interlayer insulating layer ILD1, and a second interlayer insulating layer ILD2 can cover the third metal layer. The third metal layer can be patterned in a photolithography process. The third metal layer can include metal patterns TM such as an upper electrode of the storage capacitor Cst1. The first and second interlayer insulating layers ILD1 and ILD2 can include an inorganic insulating material.

A fourth metal layer can be formed on the second interlayer insulating layer ILD2, and an inorganic insulating layer PAS1 and a first planarization layer PLN1 can be stacked on the fourth metal layer. A fifth metal layer can be formed on the first planarization layer PLN1.

A partial pattern of the fourth metal layer can be connected to the third metal layer through a contact hole which passes through the first planarization layer PLN1 and the inorganic insulating layer PAS1. The first planarization layer PLN1 and a second planarization layer PLN2 can be made of an organic insulating material which planarizes the surfaces.

The fourth metal layer can include the first and second electrodes of the TFT which are connected to the active pattern of the TFT through the contact hole passing through the second interlayer insulating layer ILD2. The data line DL and the power lines PL1, PL2, and PL3 can be implemented using a pattern SD1 of the fourth metal layer and a pattern SD2 of the fifth metal layer.

An anode AND of the light-emitting element (OLED) can be formed on the second planarization layer PLN2. The anode AND can be connected to the electrode of the TFT, which is used as a switch element or a driving element, through the contact hole passing through the second planarization layer PLN2. The anode AND can be made of a transparent or semitransparent electrode material.

A pixel definition film BNK can cover the anode AND of the light-emitting element OLED. The pixel definition film BNK is formed as a pattern that defines light-emitting regions (or open pore regions) through which light externally passes in each of the pixels. A spacer SPC can be formed on the pixel definition film BNK. The pixel definition film BNK and the spacer SPC can be made of the same organic insulating material to be integrated with each other. The spacer SPC secures the gap between a fine metal mask (FMM) and the anode AND so that the FMM may not come into contact with the anode AND in an organic compound (electro-luminance (EL)) deposition process.

An organic compound EL is formed in the light-emitting region of each of the pixels defined by the pixel definition film BNK. Cathodes CAT of the light-emitting elements OLED are formed on the entire surface of the display panel 100 to cover the pixel definition films BNK, the spacers SPC, and the organic compounds EL. The cathode CAT can be connected to the VSS line PL3 formed using any one of the metal layers thereunder. A capping layer CPL can cover the cathode CAT. The capping layer CPL is made of an inorganic insulating material and protects the cathode CAT by preventing infiltration of air and outgassing from an organic insulating material applied to the capping layer CPL. An inorganic insulating layer PAS2 can cover the capping layer CPL, and a planarization layer PCL can be formed on the inorganic insulating layer PAS2. The planarization layer PCL can include an organic insulating material. An inorganic insulating layer PAS3 of an encapsulation layer can be formed on the planarization layer PCL.

Figure 20:
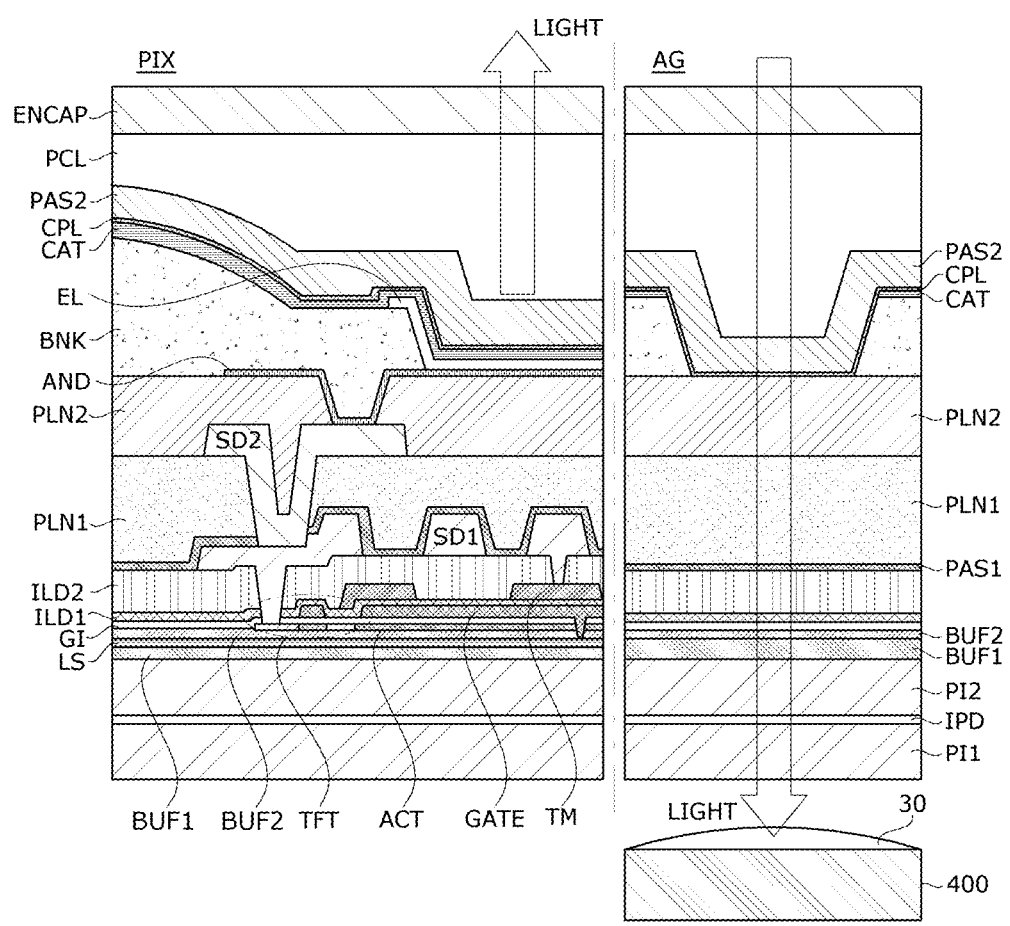
FIGS. 20 and 21 are cross-sectional views showing a light shield layer of a pixel region and a light-transmitting portion of an image-capturing area in the structures of display panels according to various embodiments of the present disclosure.
Figure 21:
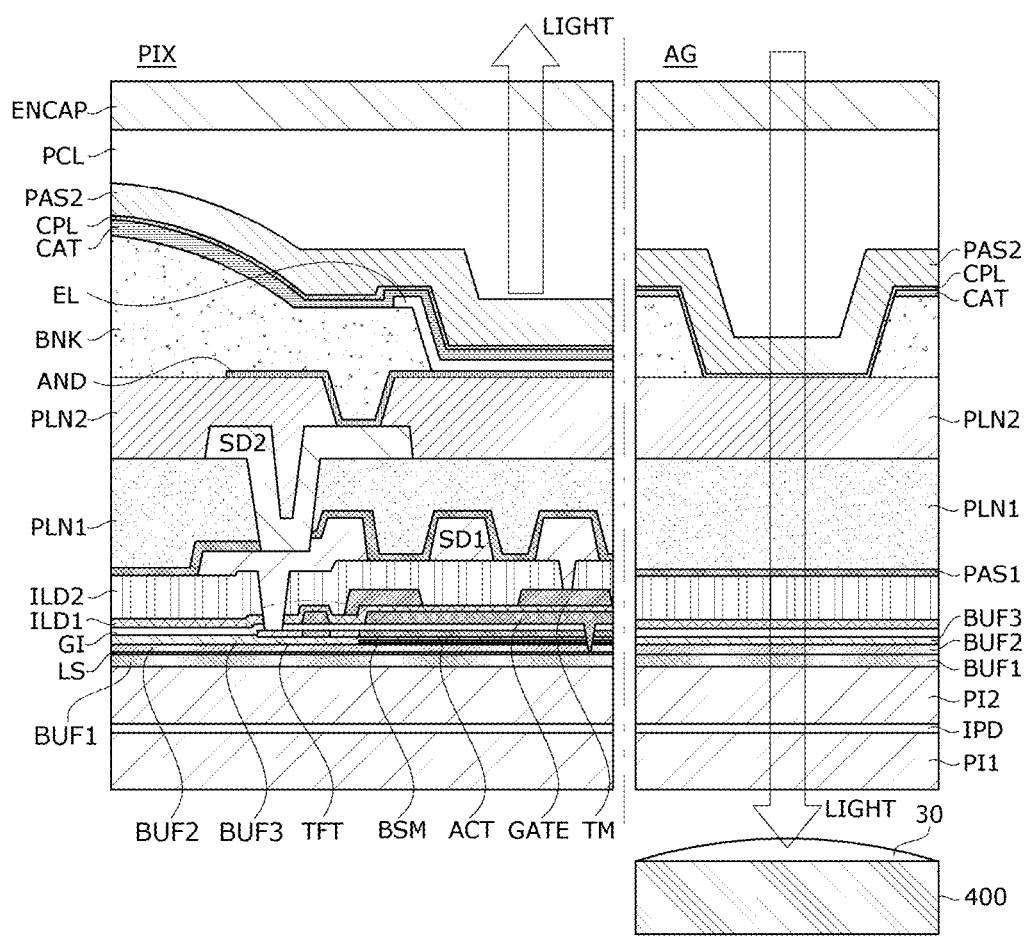

FIGS. 20 and 21 are cross-sectional views showing a light shield layer LS of a pixel region and a light-transmitting portion AG of an image-capturing area CA in the structures of display panels according to various embodiments of the present disclosure. In FIGS. 20 and 21, elements which are substantially the same as the elements shown in FIG. 19 are indicated by the same reference numerals, and detailed descriptions thereof will be omitted or may be provided briefly.

Referring to FIG. 20, the light shield layer LS protects a display area DA and a pixel region PIX in the image-capturing area CA from a laser beam LB emitted to a display panel 100 in a laser ablation process.

The light shield layer LS is removed from the region of the light-transmitting portion AG to define an open pore OP which exposes the light-transmitting portion to the laser beam LB. The laser beam LB generated in the laser ablation process removes a metal layer to be removed, for example, a cathode material of the light-transmitting region, through the open pore OP of the light shield layer LS. The light shield layer LS can be disposed under a TFT in the pixel region PIX to prevent a photocurrent of the TFT. In this case, the light shield layer LS should be made of a metal having a lower absorption coefficient than the metal layer to be removed with respect to the wavelength of the laser beam LB. When the metal layer to be removed is a cathode material of an Mg—Ag alloy, the light shield layer LS can be made of Mo which has a lower absorption coefficient than Mg with respect to the laser beam LB having a wavelength of 1,064 nm. Since Mo is a metal with a high absorption coefficient, it is possible to prevent a photocurrent of the TFT by reflecting external light.

The light shield layer LS shown in FIG. 20 is disposed between the first and second buffer layers BUF1 and BUF2 under the TFT in the pixel region PIX.

The light shield layer LS shown in FIG. 21 is an example made of a-Si. Since a-Si has a lower absorption coefficient than Mg with respect to a laser beam LB having a wavelength of 1,064 nm, it is possible to protect metal layers on a-Si from the laser beam LB for removing Mg and Ag in a laser ablation process. In this case, the light shield layer LS cannot block external light which affects a TFT in a pixel region PIX, and thus an additional light shield pattern BSM can be added to the pixel region PIX. The light shield layer LS shown in FIG. 21 is disposed between inorganic insulating layers BUF2 and BUF3 under the TFT in the pixel region PIX. In FIG. 21, the second buffer layer BUF2 is the inorganic insulating layer formed between the light shield layer LS and the light shield pattern BSM in the pixel region PIX. The third buffer layer BUF3 is the inorganic insulating layer formed between the light shield layer LS and an active layer ACT in the pixel region PIX.

All metal layers in the pixel region PIX are removed from the light-transmitting portion AG. Accordingly, only transparent insulating layers can be present in the light-transmitting portion AG.

Figure 22:
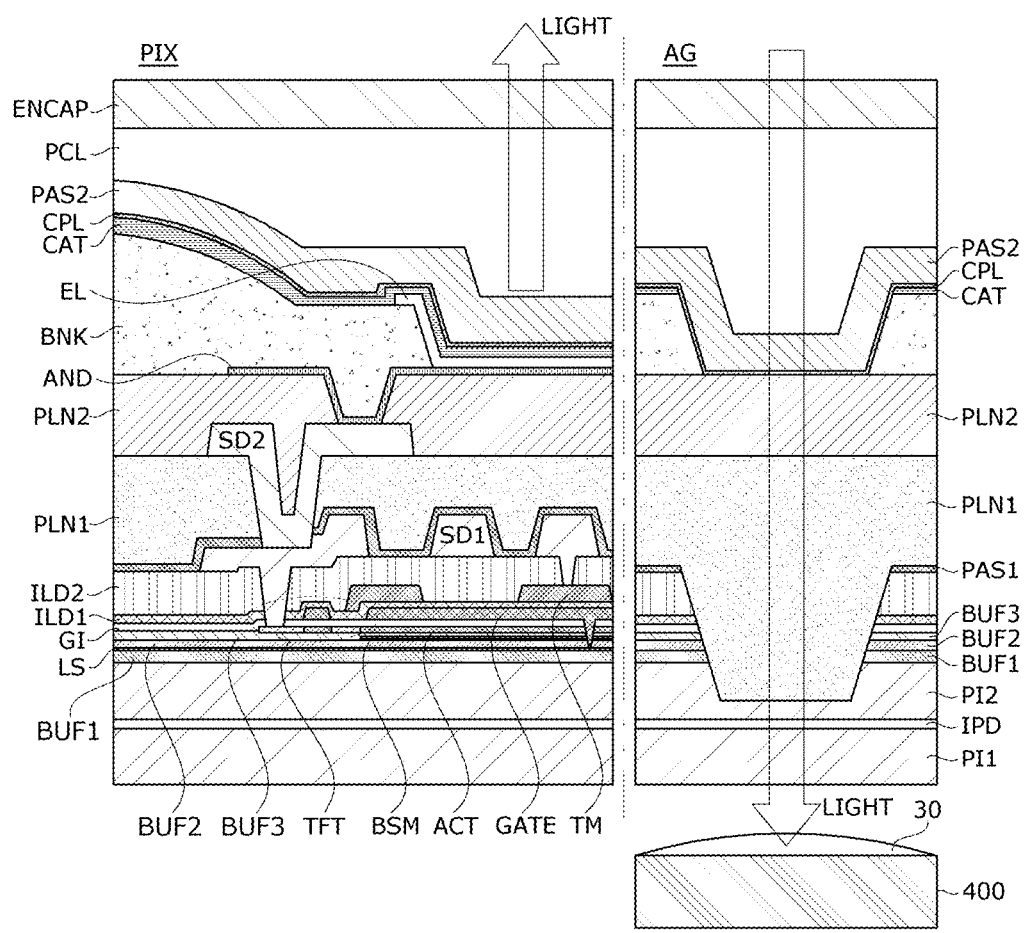
FIG. 22 is a cross-sectional view showing an example of insulating layers removable from a light-transmitting portion of an image-capturing area.

FIG. 22 is a cross-sectional view showing an example of insulating layers removable from a light-transmitting portion of an image-capturing area.

Referring to FIG. 22, any one of the PI substrates PI1 and PI2 can be removed from the light-transmitting portion AG. One or more of the inorganic insulating layers BUF1, BUF2, GI, ILD1, ILD2, and PAS1 can be removed from the light-transmitting portion AG, and one or more of the active layer ACT, the pixel definition film BNK, and the spacer SPC can be further removed. A portion recessed due to insulating layers being removed from the light-transmitting portion AG can be filled with the first planarization layer PLN1 and the second planarization layer PLN2.

Figure 23:
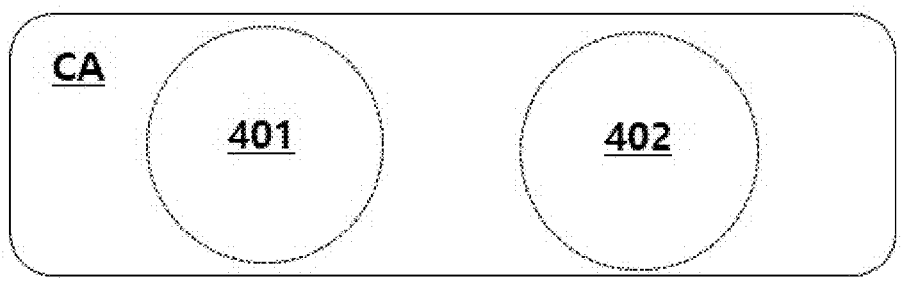
FIG. 23 is a diagram showing an example of a plurality of sensor modules disposed in an image-capturing area.

FIG. 23 is a diagram showing an example of a plurality of sensor modules disposed in an image-capturing area according to an example of the present disclosure.

As shown in FIG. 23, a plurality of sensor modules can be disposed in the image-capturing area CA. For example, an infrared sensor module can be additionally disposed in the image-capturing area CA together with the imaging element module 400. Another sensor, such as an illuminance sensor or a proximity sensor, can be additionally disposed in the image-capturing area CA. Pixels can be arranged at high PPI together with the light-transmitting portions AG in light-receiving surfaces 401 and 402 of the imaging element module 400 and the infrared sensor module. Since the transmissivity of an infrared wavelength is higher than that of a visible light wavelength at thin films in the image-capturing area CA, the number and/or size of the light-transmitting portions AG in the light-receiving surface 402 of the infrared sensor module can be smaller than the number and/or size of the light-transmitting portions AG in the light-receiving surfaces of the imaging element module 400, or the light-transmitting portions AG may not be present in the light-receiving surface 402 of the infrared sensor module. Meanwhile, the infrared sensor module can sense infrared light and can be used for face recognition.

The light shield layer LS can be made of a plurality of different materials depending on region in the image-capturing area CA. For example, as shown in FIG. 22, when the infrared sensor module as well as the imaging element module 400 is disposed in the image-capturing area CA, the light shield layer LS of an area in which the imaging element module 400 is disposed can have a higher transmissivity than the light shield layer LS of a region in which the infrared sensor module is disposed. The transmissivity of the light shield layer LS can vary according to what kind of electronic module is disposed in a region of the light shield layer LS. For example, a-Si can be used as the light shield layer LS in the light-receiving surface 402 of the infrared sensor module, and Mo can be used as the light shield layer LS in the light-receiving surface 401 of the imaging element module 400.

While the embodiments of the present disclosure have been described in detail above with reference to the accompanying drawings, the present disclosure is not limited to the embodiments, and various changes and modifications can be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by the embodiments. Therefore, it should be understood that the embodiments set forth herein are illustrative rather than restrictive in all respects. The scope of the present disclosure should be construed in accordance with the claims, and all technical spirits of their equivalents should be construed as falling into the scope of the present disclosure.

What is claimed is:

1. A display panel comprising:
    a display area including a first pixel region in which a plurality of pixels are disposed; and
    an image-capturing area including a second pixel region in which a plurality of pixel groups are disposed and a plurality of light-transmitting portions are disposed between the pixel groups,
    wherein the light-transmitting portions are disposed along virtual spiral reference lines which spirally extend outward from a center of the image-capturing area, and
    sizes of the light-transmitting portions increase as a distance from the center of the image-capturing area increases.

2. The display panel of claim 1, wherein the virtual spiral reference lines include Fibonacci spirals.

3. The display panel of claim 1, wherein each of the light-transmitting portions is in a circular shape or an oval shape.

4. The display panel of claim 1, wherein each of the first pixel region and the second pixel region includes:
    a light shield layer; and
    a metal layer having a higher absorption coefficient than the light shield layer with respect to a specific wavelength of a laser beam,
    wherein the light shield layer includes a metal or an inorganic film, and is removed from light-transmitting regions in the image-capturing area to expose the light-transmitting portions, and
    the metal layer is removed from the light-transmitting regions in the image-capturing area to expose the light-transmitting portions.

5. The display panel of claim 4, wherein at least one of the light-transmitting portions includes overlapping regions which overlap the pixel groups, and
    the light shield layer is not removed from the overlapping regions.

6. The display panel of claim 4, wherein at least some of the light-transmitting portions include overlapping regions which overlap the pixel groups, and
    the metal layer is not removed from the overlapping regions.

7. The display panel of claim 4, wherein the light shield layer includes molybdenum (Mo) or amorphous silicon (a-Si), and
    the metal layer includes magnesium (Mg).

8. The display panel of claim 7, wherein the first and second pixel regions include:
    a circuit layer on a substrate; and
    a light-emitting element layer on the circuit layer, and
    the light shield layer is disposed in the circuit layer.

9. The display panel of claim 8, wherein the circuit layer includes a transistor connected to a light-emitting element of the light-emitting element layer, and
    the light shield layer is disposed between inorganic insulating layers under the transistor.

10. The display panel of claim 9, wherein each of the pixel regions of the display area and the image-capturing area further includes a light shield pattern disposed between the light shield layer and the transistor, and
    the light shield pattern includes a metal.

11. The display panel of claim 1, wherein the first pixel region has higher pixels per inch (PPI) than the second pixel region.

12. A display device comprising:
    a display panel including a display area including a first pixel region in which a plurality of pixels are disposed, and an image-capturing area including a second pixel region in which a plurality of pixel groups are disposed and a plurality of light-transmitting portions are disposed between the pixel groups;
    a cover glass configured to cover the display panel; and
    an imaging element module disposed under the display panel and opposite to the image-capturing area,
    wherein the light-transmitting portions are disposed along virtual spiral reference lines which spirally extend outward from a center of the image-capturing area, and
    sizes of the light-transmitting portions increase as a distance from the center of the image-capturing area increases.

13. The display device of claim 12, wherein the virtual spiral reference lines include Fibonacci spirals.

14. The display device of claim 12, wherein each of the light-transmitting portions is in a circular shape or an oval shape.

15. The display device of claim 12, wherein each of the first pixel region and the second pixel region includes:
    a light shield layer; and
    a metal layer having a higher absorption coefficient than the light shield layer with respect to a specific wavelength of a laser beam,
    wherein the light shield layer includes a metal or an inorganic film, and is removed from light-transmitting regions in the image-capturing area to expose the light-transmitting portions, and
    the metal layer is removed from the light-transmitting regions in the image-capturing area to expose the light-transmitting portions.

16. The display device of claim 15, wherein at least one of the light-transmitting portions includes overlapping regions which overlap the pixel groups, and
    the light shield layer and the metal layer are not removed from the overlapping regions.

17. The display device of claim 16, wherein the first and second pixel regions include:
    a circuit layer on a substrate; and
    a light-emitting element layer on the circuit layer, and
    the light shield layer is disposed in the circuit layer.

18. The display device of claim 17, wherein the circuit layer includes a transistor connected to a light-emitting element of the light-emitting element layer, and
    the light shield layer is disposed between inorganic insulating layers under the transistor.

19. The display device of claim 18, wherein each of the pixel regions of the display area and the image-capturing area further includes a light shield pattern disposed between the light shield layer and the transistor, and
    the light shield pattern includes a metal.

20. The display device of claim 12, wherein the first pixel region has higher pixels per inch (PPI) than the second pixel region.

* * * * *